(12) United States Patent
Shibata et al.

(10) Patent No.: US 6,815,870 B2
(45) Date of Patent: Nov. 9, 2004

(54) SURFACE ACOUSTIC WAVE DEVICE AND COMMUNICATION DEVICE INCLUDING SAME

(75) Inventors: Osamu Shibata, Ishikawa-ken (JP); Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/348,189

(22) Filed: Jan. 22, 2003

(65) Prior Publication Data

US 2003/0168932 A1 Sep. 11, 2003

(30) Foreign Application Priority Data

Jan. 22, 2002 (JP) ........................................ 2002-012799
Nov. 11, 2002 (JP) ........................................ 2002-327478

(51) Int. Cl.[7] ............................................. H01L 41/08
(52) U.S. Cl. ................................... 310/313 R; 333/193
(58) Field of Search ...................... 333/193; 310/313 B, 310/313 D, 313 A, 313 R

(56) References Cited

U.S. PATENT DOCUMENTS

| | | | | |
|---|---|---|---|---|
| 5,568,002 A | * | 10/1996 | Kawakatsu et al. | 310/313 B |
| 5,585,684 A | * | 12/1996 | Abe | 310/313 A |
| 5,994,980 A | * | 11/1999 | Tada | 333/193 |
| 6,023,204 A | * | 2/2000 | Ikata et al. | 333/193 |
| 6,255,915 B1 | * | 7/2001 | Edmonson | 333/193 |
| 6,713,940 B2 | * | 3/2004 | Takamine | 310/313 R |

\* cited by examiner

*Primary Examiner*—Thomas M. Dougherty
*Assistant Examiner*—Karen Beth Addison
(74) *Attorney, Agent, or Firm*—Keating & Bennett PLLC

(57) ABSTRACT

A surface acoustic wave device having an unbalanced-to-balanced conversion function, which is capable of improving balanced characteristics, includes a first resonator filter and a second resonator filter, having a plurality of interdigital transducers disposed along the propagation direction of a surface acoustic wave. The surface acoustic wave device has an unbalanced-to-balanced conversion function as a result of the phase of the second resonator filter being reversed by 180° with respect to that of the first resonator filter. The surface acoustic wave device further includes a first resonator connected in series to an unbalanced signal terminal side of the first resonator filter, and a second resonator connected in series to an unbalanced signal terminal side of the second resonator filter. The first resonator and the second resonator have different design parameters.

16 Claims, 29 Drawing Sheets

SURFACE ACOUSTIC WAVE DEVICE AND COMMUNICATION DEVICE INCLUDING SAME

BACKGROUND OF THE INVENTION

1. Field of the Invention

The present invention relates to a surface acoustic wave device for use in, for example, delay lines, filters, and other electronic components, and to a communication device including a surface acoustic wave device.

2. Description of the Related Art

Since electronic devices have become smaller in size and lighter in weight in recent years, there has been an increasing demand for electronic devices with multiple functions. With such a background, there has also been an increasing demand for surface acoustic wave filters (hereinafter referred to as "SAW filters") incorporated in surface acoustic wave devices used in communication devices, such as cellular phones, to have an unbalanced-to-balanced conversion function so that the SAW filters can be directly connected to an IC which operates by using a balanced input, and active research has been intensively carried out in this area.

In particular, in a SAW filter formed of a resonator filter, having an unbalanced-to-balanced conversion function, the amplitude difference and the phase difference on the balanced side are important characteristics (hereinafter referred to as "balanced characteristics"), and it is necessary that the amplitude difference be 0 dB and the phase difference be 180° on the balanced side. However, in practice, since the tendencies of the balanced characteristics also differ according to the structure of the SAW filter, it is not possible to accurately achieve an amplitude difference of 0 dB and a phase difference of 180°, and improvement of the balanced characteristics with respect to the structure of the SAW filter has become an important objective in such devices.

For the surface acoustic wave device having an unbalanced-to-balanced conversion function, there are various structures depending on the type and purpose of an IC. For example, for the surface acoustic wave device in which the matching impedance on the balanced side is approximately four times as large as the matching impedance on the unbalanced side, the structure such as that shown in FIG. 12 is widely used.

A surface acoustic wave device shown in FIG. 12 is configured in such a manner that a resonator filter 100 and a resonator filter 101, which is 180° out of phase with the resonator filter 100, are provided on a piezoelectric substrate (not shown).

The resonator filter 100 is provided with a comb-shaped electrode (an interdigital transducer, hereinafter abbreviated as an "IDT") 101, and IDTs 102 and 103 are arranged on the right and left sides (the right and left direction along the propagation direction of the surface acoustic wave) of the IDT 101. Furthermore, in the resonator filter 100, reflectors 104 and 105 are arranged so as to sandwich the IDTs 101, 102, and 103 from the right and left (the right and left direction along the propagation direction of the surface acoustic wave), respectively.

The IDT is formed from a metal thin-film of aluminum, etc., and functions as a surface acoustic wave conversion section which converts an input electrical signal (AC) into surface acoustic waves (SAW energy) so that the surface acoustic waves propagate on the piezoelectric substrate, and which converts the propagated surface acoustic waves into electrical signals and outputs them. The reflector is used to reflect the propagated surface acoustic waves back in the direction from which they came in order to improve the conversion efficiency.

In such an IDT, it is possible to set signal conversion characteristics and a passband by setting the length and the width of each comb-shaped electrode finger, the spacing between adjacent comb-shaped electrode fingers, and the finger overlap indicating the opposing length in an inter-digitated state between mutual comb-shaped electrode fingers. In the reflector, reflection characteristics can be set by adjusting the width of each reflector electrode finger and the spacing between fingers.

A resonator filter 110 is provided with an IDT 111 in which the hot side (signal side) and the ground side of the electrode finger are reversed with respect to the IDT 101 in the resonator filter 100 so that the phase differs by 180° with respect to the resonator filter 100. IDTs 112 and 113 are provided on the right and left (the right and left direction along the propagation direction of the surface acoustic wave) of the IDT 111. Furthermore, in the resonator filter 110, reflectors 114 and 115 for reflecting surface acoustic waves in order to improve the conversion efficiency are arranged so as to sandwich the IDTs 111, 112, and 113 from the right and left, respectively.

More specifically, there are provided an unbalanced signal terminal 170 to which the IDTs 102 and 103 in the resonator filter 100 and the IDTs 112 and 113 in the resonator filter 110 are connected in parallel, and balanced signal terminals 180 and 190 which are connected in series to the IDTs 101 and 1111, respectively. That is, one side of each of the resonator filters 100 and 110 which are 180° out of phase with each other is connected, and a surface acoustic wave device having an unbalanced-to-balanced conversion function is configured in such a manner that the connected unbalanced signal terminal 170 is an unbalanced terminal and the balanced signal terminals 180 and 190 which are not connected are balanced terminals. For this surface acoustic wave device, high attenuation and sharpness of attenuation outside the passband are required.

Therefore, as shown in FIG. 13, in each of the terminals 170, 180, and 190 of the surface acoustic wave device shown in FIG. 12, by arranging in series trapping resonators 130, 140, and 150 having resonators 131, 141, and 151, respectively, high attenuation and sharpness of attenuation can be obtained outside the passband.

However, the above-described structure has factors that deteriorate balanced characteristics. For example, since the hot side and the ground side of the electrode finger in the central IDT 111 of the resonator filter 110 are reversed with respect to those of the IDT 101 in the resonator filter 100 so that the phase differs by 180° with respect to the resonator filter 100, the number of the hot side and the ground side of the resonator filter 100 and that of the resonator filter 110 differ, and the ground side and the hot side are aligned in the IDT-IDT interface, causing an unwanted electric-field to be generated. As one of the countermeasures to improve these balanced characteristics, there is a method of grounding the hot electrode finger, but still a problem remains in the balanced characteristics.

For the surface acoustic wave device shown in FIG. 12, an ideal state is that only the phase difference is 180° between the resonator filter 100 and the resonator filter 110 in the vicinity of the passband. However, after all, for the reasons described above, in practice, the impedance, etc., also differs. As a result, the balanced characteristics deviate from the ideal amplitude difference of 0 dB and the ideal phase difference of 180°. Such an inconvenience is a problem which inherently occurs in a surface acoustic wave device having an unbalanced-to-balanced conversion function, including 2-system filter sections which are 180° out of phase with each other. Furthermore, there is no effective practical method for solving such problems when the balanced characteristics experience these problems.

SUMMARY OF THE INVENTION

In order to overcome the problems described above, preferred embodiments of the present invention provide a surface acoustic wave device having an unbalanced-to-balanced conversion function, in which balanced characteristics are greatly improved.

According to a preferred embodiment of the present invention, a surface acoustic wave device includes a first surface acoustic wave element having a plurality of interdigital transducers arranged along the propagation direction of a surface acoustic wave, and a second surface acoustic wave element having a plurality of interdigital transducers arranged along the propagation direction of a surface acoustic wave, the surface acoustic wave device having an unbalanced-to-balanced conversion function as a result of the phase of the second surface acoustic wave element being reversed by 180° with respect to the first surface acoustic wave element, a first resonator which is connected in series to the unbalanced side of the first surface acoustic wave element, and a second resonator which is connected in series to the unbalanced side of the second surface acoustic wave element, and the first resonator and the second resonator have different design parameters. The first resonator and the second resonator are preferably surface acoustic wave resonators including at least one interdigital transducer and reflectors arranged so as to sandwich the at least one interdigital transducer.

According to the above-described arrangement, since the first resonator and the second resonator are designed in accordance with the characteristics of the first surface acoustic wave element and the second surface acoustic wave element, respectively, balanced characteristics of the surface acoustic wave device in unbalanced-to-balanced conversion can be improved by adjusting the design parameters of the first and second resonators.

In the surface acoustic wave device of preferred embodiments of the present invention, in addition to the above-described arrangement, the design parameters may be the number of electrode fingers of the reflectors and/or the interdigital transducer in the first resonator and the second resonator.

According to the above-described arrangement, balanced characteristics of the output on the balanced side can be improved by changing the number of electrode fingers in each resonator.

In the surface acoustic wave device of preferred embodiments of the present invention, in addition to the above-described arrangement, the design parameters are preferably the amount of finger overlaps in the first resonator and the second resonator.

According to the above-described arrangement, balanced characteristics of the output on the balanced side can be improved by changing the finger overlap in each resonator.

In the surface acoustic wave device of preferred embodiments of the present invention, in addition to the above-described arrangement, the design parameters may be duties in the first resonator and the second resonator. Furthermore, when the duties of reflectors and/or an interdigital transducer in the first resonator and the second resonator are denoted as x and y, respectively, the relationship of $0<|x-y|\leq 0.05$ is preferably satisfied.

According to the above-described arrangement, balanced characteristics of the output on the balanced side can be improved by changing the duty in each resonator.

According to the above-described arrangement, balanced characteristics of the output on the balanced side can be improved by changing the ratio of the first resonator to the second resonator.

In the surface acoustic wave device of preferred embodiments of the present invention, in addition to the above-described arrangement, the design parameters may be the distances between the centers of the outermost electrode fingers of the reflectors and the interdigital transducer in the first resonator and the second resonator. Furthermore, when the wavelength determined by the structure of the interdigital transducer of the surface acoustic wave element is denoted as $\lambda$, and the distances between the centers of the outermost electrode fingers of the reflectors and the interdigital transducer in the first resonator and the second resonator are denoted as $X\lambda$ and $Y\lambda$, respectively, the relationship of $(0+0.5\ n)\lambda<|X-Y|\lambda\leq(0.18+0.5\ n)\lambda$, where $n=0, 1, 2 \ldots$, is preferably satisfied.

According to the above-described arrangement, since the distances between the centers of the outermost electrode fingers of the first resonator and the second resonator differ, the amplitude and phase characteristics of the first resonator and the second resonator differ, and the deviation of the degree of balance at higher frequencies of the passband in the first surface acoustic wave element and the second surface acoustic wave element can be corrected. Therefore, it is possible to obtain a surface acoustic wave device having a large common-mode attenuation at higher frequencies of the passband.

In the surface acoustic wave device of preferred embodiments of the present invention, in addition to the above-described arrangement, the design parameters may be the pitch ratios of the reflectors and the interdigital transducer in the first resonator and the second resonator. Furthermore, when the pitch ratios of the reflectors and the interdigital transducer (pitch of the interdigital transducer/pitch of the reflectors) in the first resonator and the second resonator are denoted as a and b, respectively, the relationship of $0.984\leq a/b<1$ is preferably satisfied.

According to the above-described arrangement, since the pitch ratio of the interdigital transducer and the reflector of the first resonator and the second resonator are different, the amplitude and phase characteristics of the first resonator and the second resonator differ, and the deviation of the degree of balance at higher frequencies of the passband in the first surface acoustic wave element and the second surface acoustic wave element can be corrected. Therefore, it is possible to obtain a surface acoustic wave device having a large common-mode attenuation at higher frequencies of the passband.

The surface acoustic wave device may be housed in a package by a face-down technique or other suitable mounting technique.

The communication device of another preferred embodiment of the present invention includes one of the above-described surface acoustic wave devices according to other preferred embodiments of the present invention.

Other features, elements, characteristics and advantages of the present invention will become more apparent from the following detailed description of preferred embodiments thereof with reference to the attached drawings.

DETAILED DESCRIPTION OF PREFERRED EMBODIMENTS

First Preferred Embodiment

Figure 1:
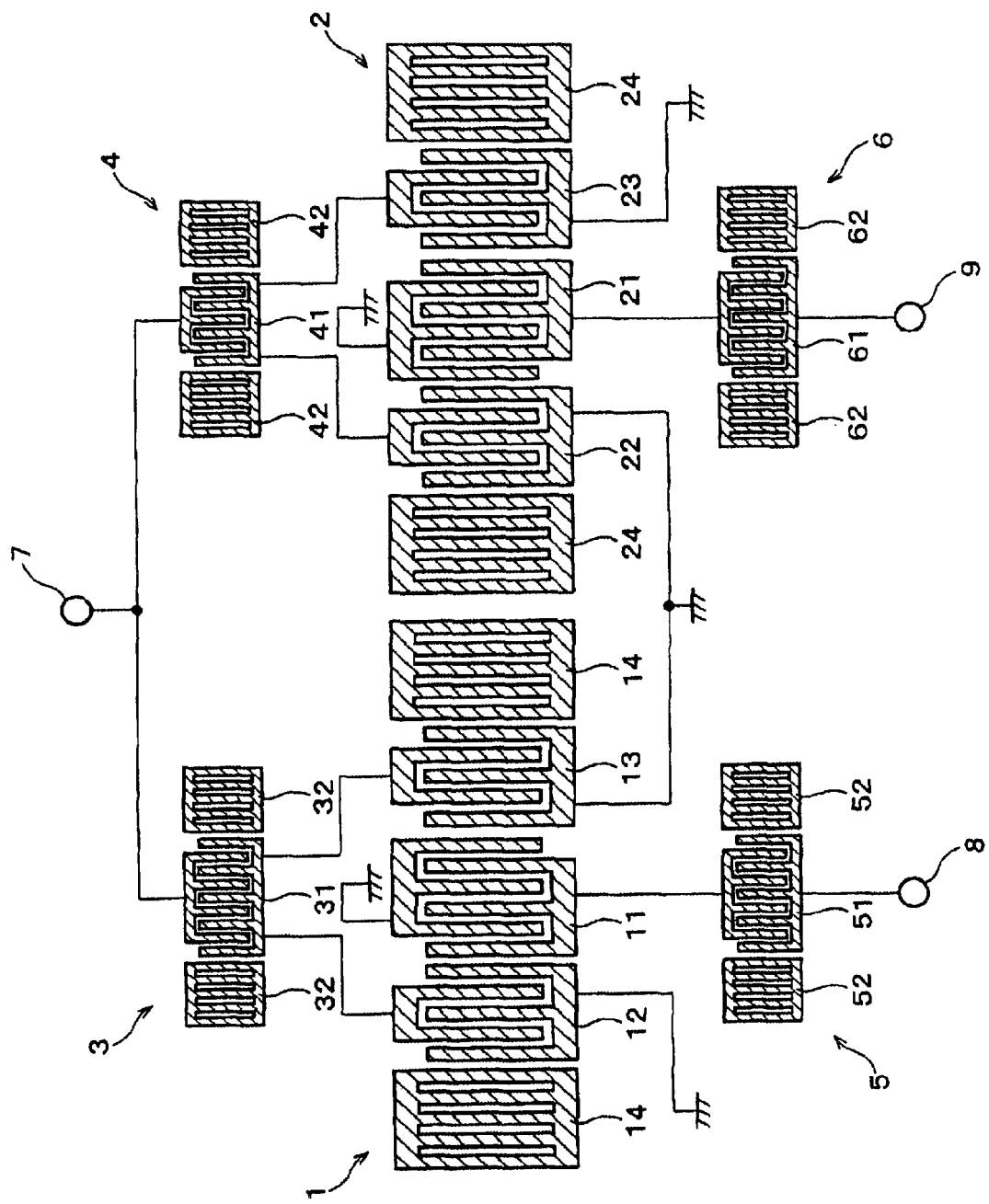
FIG. 1 is a schematic diagram of a surface acoustic wave device according to a first preferred embodiment of the present invention.

A preferred embodiment of the present invention will now be described below with reference to FIGS. 1 to 7. As shown in FIG. 1, a surface acoustic wave device (SAW device) having an unbalanced-to-balanced conversion function according to this preferred embodiment is configured to include resonator filters (surface acoustic wave element, SAW filter) 1 and 2. The resonator filters 1 and 2 have approximately identical passbands. The resonator filters 1 and 2 are provided on a piezoelectric substrate (not shown). The piezoelectric substrate is preferably formed of lithium tantalate, lithium niobate, or other suitable material.

In the resonator filter 1, IDTs 12 and 13 are arranged on the right and left (the right and left direction along the propagation direction of the surface acoustic wave) of an IDT 11 which is located at the approximate center. Reflectors 14 are arranged so as to sandwich the IDTs 11, 12, and 13 from the right and left (the right and left direction along the propagation direction of the surface acoustic wave), respectively.

In the resonator filter 2, IDTs 22 and 23 are arranged on the right and left (the right and left direction along the propagation direction of the surface acoustic wave) of an IDT 21 which is located at the approximate center. Reflectors 24 are arranged so as to sandwich the IDTs 21, 22, and 23 from the right and left (the right and left direction along the propagation direction of the surface acoustic wave), respectively.

The IDT 11 and the IDT 21 are arranged in such a manner that the hot side (signal side) and the ground side of their electrode fingers are reversed, with the result that the resonator filter 1 and the resonator filter 2 are 180° out of phase with each other.

The resonator filters 1 and 2 are connected in parallel to an unbalanced signal terminal 7. The resonator filter 1 is connected in series to a balanced signal terminal 8, and the resonator filter 2 is connected in series to a balanced signal terminal 9.

In order to improve attenuation outside the passband, trapping resonators 3 and 5 are connected in series to the resonator filter 1, and trapping resonators 4 and 6 are connected in series to the resonator filter 2. Furthermore, the trapping resonators 3 and 4 are connected to the unbalanced signal terminal 7. The trapping resonators 5 and 6 are connected to the balanced signal terminals 8 and 9, respectively. As described above, since the trapping resonator on the unbalanced signal terminal 7 side is divided into the trapping resonators 3 and 4, balanced characteristics can be adjusted more satisfactorily.

The trapping resonators 3, 4, 5, and 6 include resonators 31, 41, 51, and 61, respectively, and are arranged to be sandwiched by reflectors 32, 42, 52, and 62, respectively, along the propagation direction of the surface acoustic wave.

More specifically, the IDTs 12 and 13 of the resonator filter 1 are connected to the resonator 31 of the trapping resonator 3. The IDT 11 of the resonator filter 1 is connected to a resonator 51 of the trapping resonator 5. The IDTs 22 and 23 of the resonator filter 2 are connected to the resonator 41 of the trapping resonator 4. The IDT 21 of the resonator filter 2 is connected to the resonator 61 of the trapping resonator 6.

With the above-described arrangement, the surface acoustic wave device has an unbalanced-to-balanced conversion function in which the impedance of each of the balanced signal terminals 8 and 9 is approximately four times as large as the impedance of the unbalanced signal terminal 7.

In this preferred embodiment, a description will now be given of a case in which the unbalanced signal terminal 7 side is designed to have an impedance of about 50 Ω and the balanced signal terminals 8 and 9 sides are designed to have an impedance of about 200 Ω. In order to study balanced characteristics by the number of electrode fingers in the trapping resonator, a description will now be given by using a specific example. The design parameters in the surface acoustic wave device are shown in Table 1. The numbers of the electrode fingers in the trapping resonators 3 and 4 are denoted as $N_1$ and $N_2$, respectively, and it is assumed that $N_1 \neq N_2$.

TABLE 1

|  | Filter 1 | Filter 2 | Filter 3 | Filter 4 | Filter 5 | Filter 6 |
|---|---|---|---|---|---|---|
| Number of reflectors | 100 | 100 | 30 | 30 | 30 | 30 |
| Number of center IDTs | 31 | 31 | $N_1$ | $N_2$ | 161 | 161 |
| Number of outer IDTs | 25 | 25 | — | — | — | — |
| Finger overlap (μm) | 110 | 110 | 85 | 85 | 50 | 50 |
| Center frequency (MHz) | 1960 | 1960 | 1997 | 1997 | 2060 | 2060 |

In the surface acoustic wave device of the design shown in Table 1, as shown in Table 2, the balanced characteristics of the surface acoustic wave device were studied by making changes based on combinations (1) to (3) of the number of electrode fingers $N_1$ in the trapping resonator 3 and the number of electrode fingers $N_2$ in the trapping resonator 4. Furthermore, the ratio of the numbers of electrode fingers in the trapping resonators 3 and 4 is also shown.

TABLE 2

|  | $N_1$ | $N_2$ | $N_2/N_1$ |
|---|---|---|---|
| (1) | 345 | 297 | 0.86 |
| (2) | 337 | 305 | 0.91 |
| (3) | 329 | 313 | 0.95 |

Figure 2:
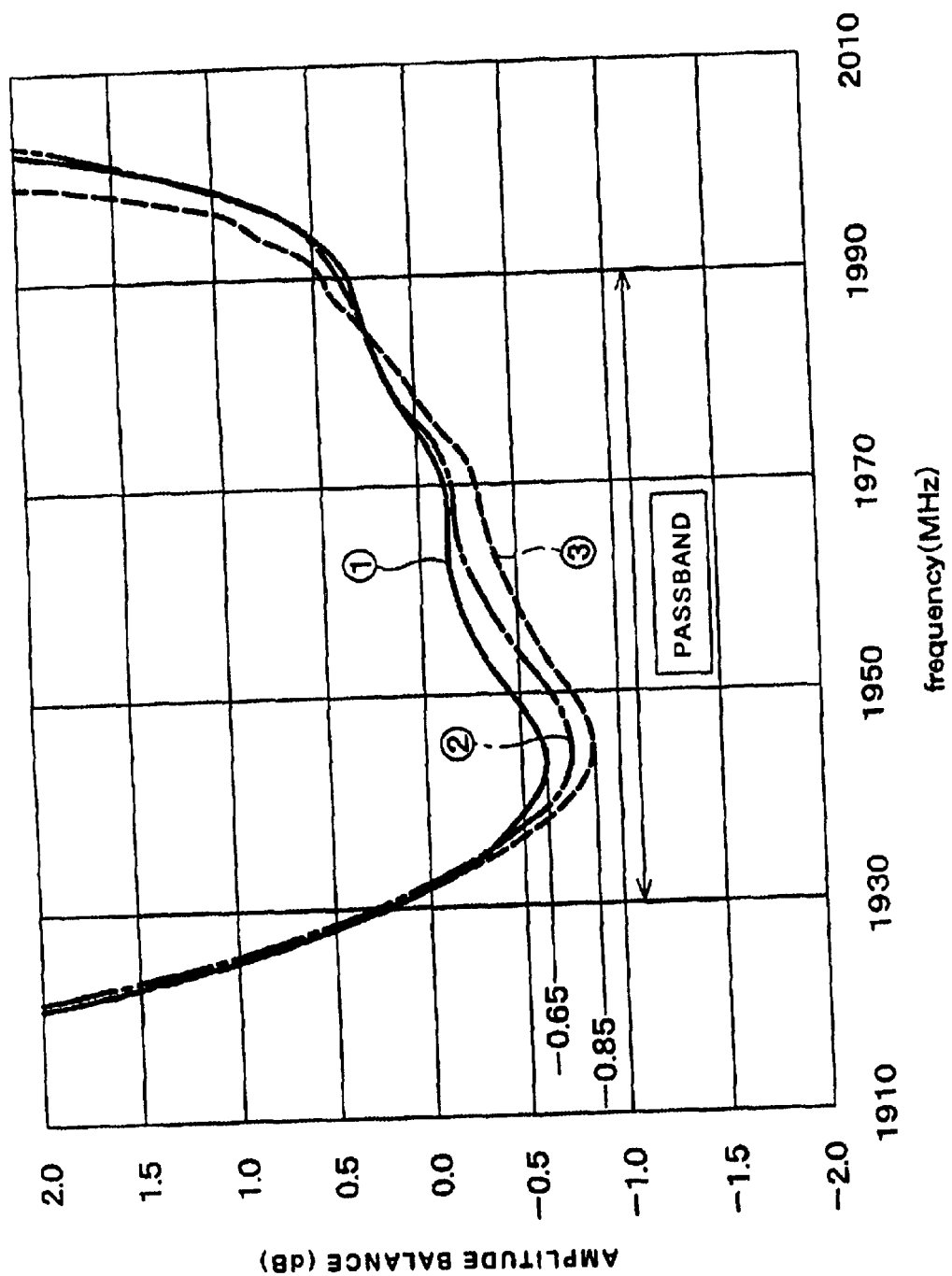
FIG. 2 is a graph showing the degree of the amplitude balance when the number of electrode fingers in a resonator of a trapping resonator of the surface acoustic wave device is changed.

FIG. 2 shows a graph of the degree of the amplitude balance of the surface acoustic wave device in the combinations (1) to (3). As can be seen from this graph, if $N_2/N_1$ is increased, the extreme value decreases, and the characteristics at higher frequencies shift toward lower frequencies. The comparison of the extreme values in (1) and (3) shows that the degree of the amplitude balance is changed from 0.65 dB to 0.85 dB.

Figure 3:
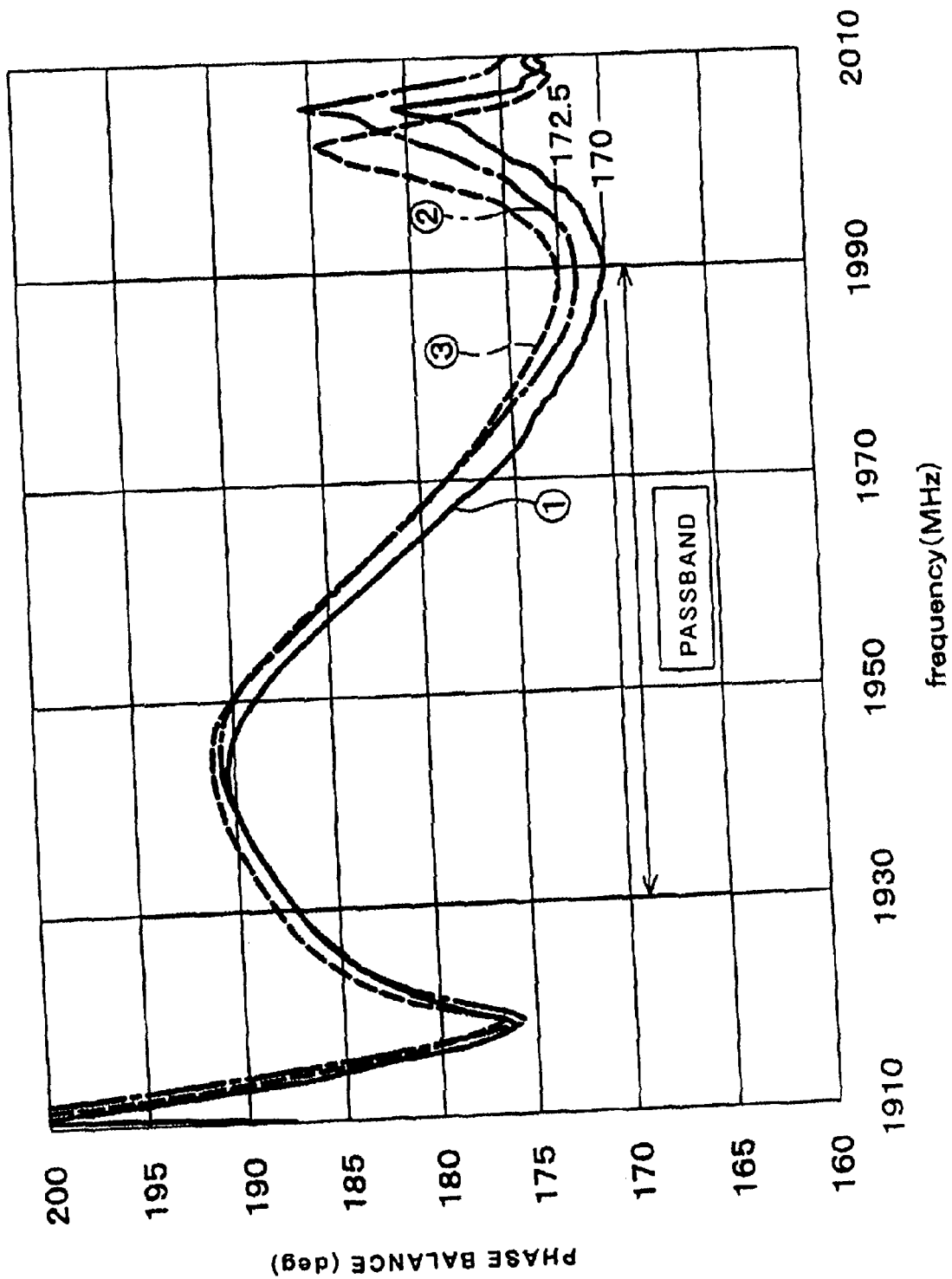
FIG. 3 is a graph showing the degree of the phase balance when the number of electrode fingers in a resonator of a trapping resonator of the surface acoustic wave device is changed.

FIG. 3 shows a graph of the degree of the phase balance of the surface acoustic wave device in the combinations (1) to (3). As can be seen from this graph, if $N_2/N_1$ is increased, the degree of the phase balance shifts upwards as a whole (in such a manner that the degree of the phase balance increases). In particular, the amount of changes in the higher frequencies is great, and the degree of the phase balance is changed from 170° to 172.5° in the comparison between (1) and (3).

It can be seen that, as a result of changing the number of electrode fingers of the trapping resonator connected to the unbalanced signal terminal side in the manner described above, the balanced characteristic are changed. That is, although the balanced characteristics differ depending on the design of the resonator filter, the balanced characteristics can be adjusted by changing the number of electrode fingers of the resonator in the trapping resonator connected to the unbalanced signal terminal side. In the case of this preferred embodiment, as $N_2/N_1$ is increased, the degree of the phase balance shifts upwards as a whole, and when the amount of change of the minimum value is compared with the maximum value in the passband, the amount of change of the minimum value is greater.

Figure 4:
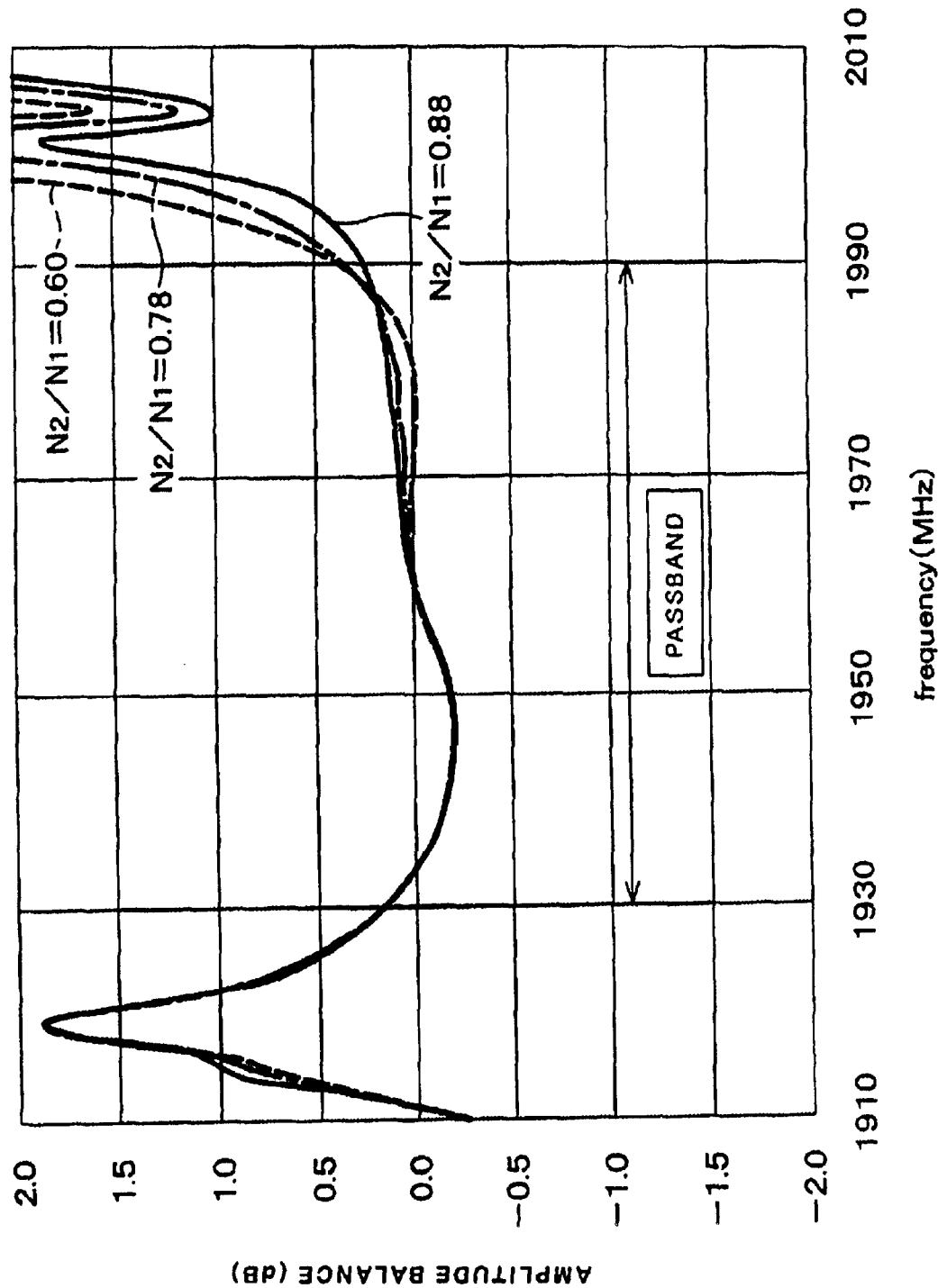
FIG. 4 is a graph showing the degree of the amplitude balance which is simulated by changing the number of electrode fingers in a resonator of a trapping resonator of the surface acoustic wave device.
Figure 5:
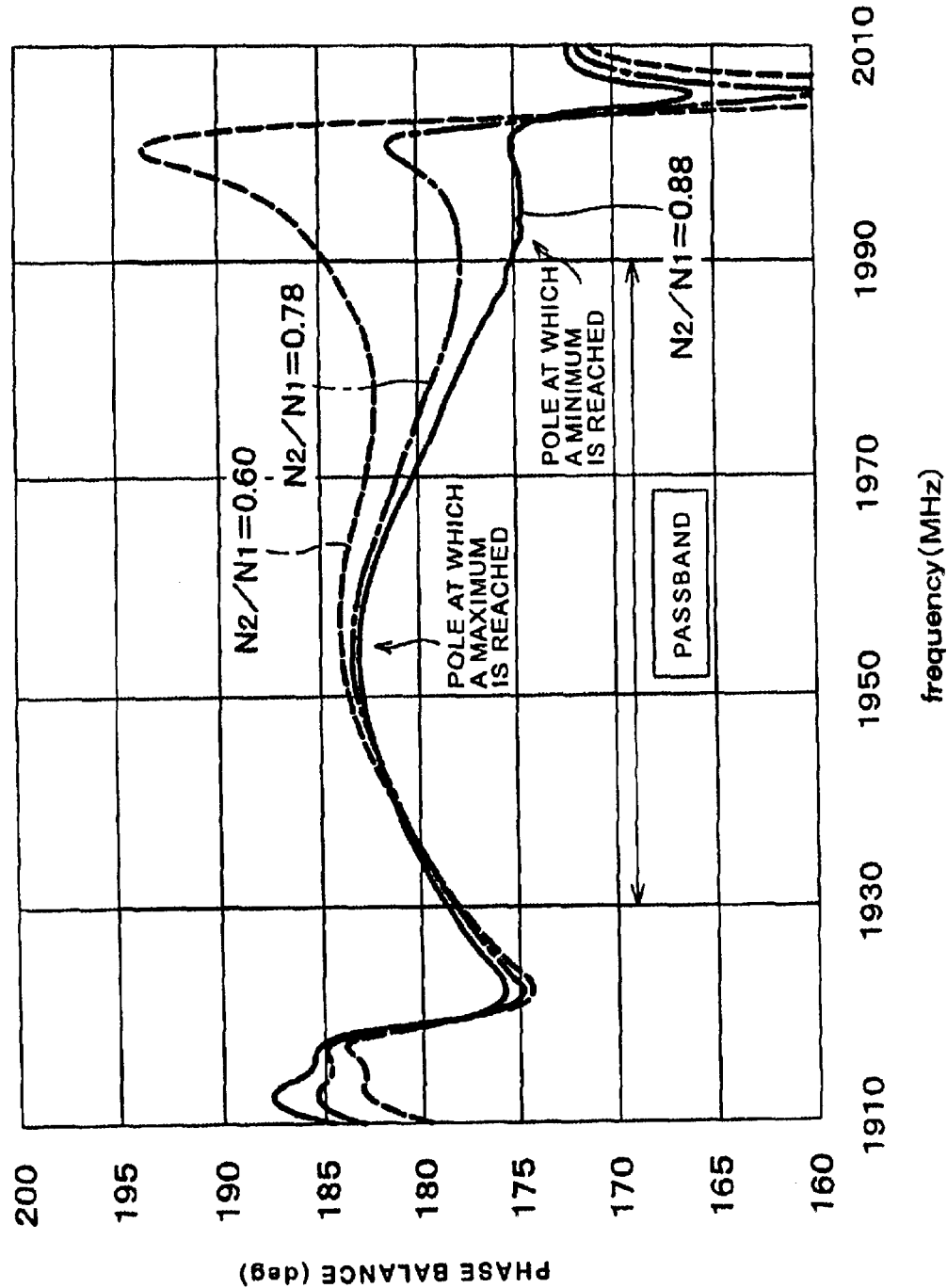
FIG. 5 is a graph showing the degree of the phase balance which is simulated by changing the number of electrode fingers in a resonator of a trapping resonator of the surface acoustic wave device.

FIGS. 4 and 5 show changes in balanced characteristics when the number of electrode fingers in a resonator in a trapping resonator connected to the unbalanced signal terminal side is changed in a simplified simulation. It can be seen from the results that, for the degree of the amplitude balance and the degree of the phase balance, the amount of changes at higher frequencies is great. This fact matches the tendencies of the actually measured values, and shows that the control of parameters is possible by simulation. The above-described simulation may be performed on the basis of, for example, an equivalent circuit method. Examples of the equivalent circuit method include an equivalent circuit model, a mode coupling theory, and other suitable methods.

Figure 6:
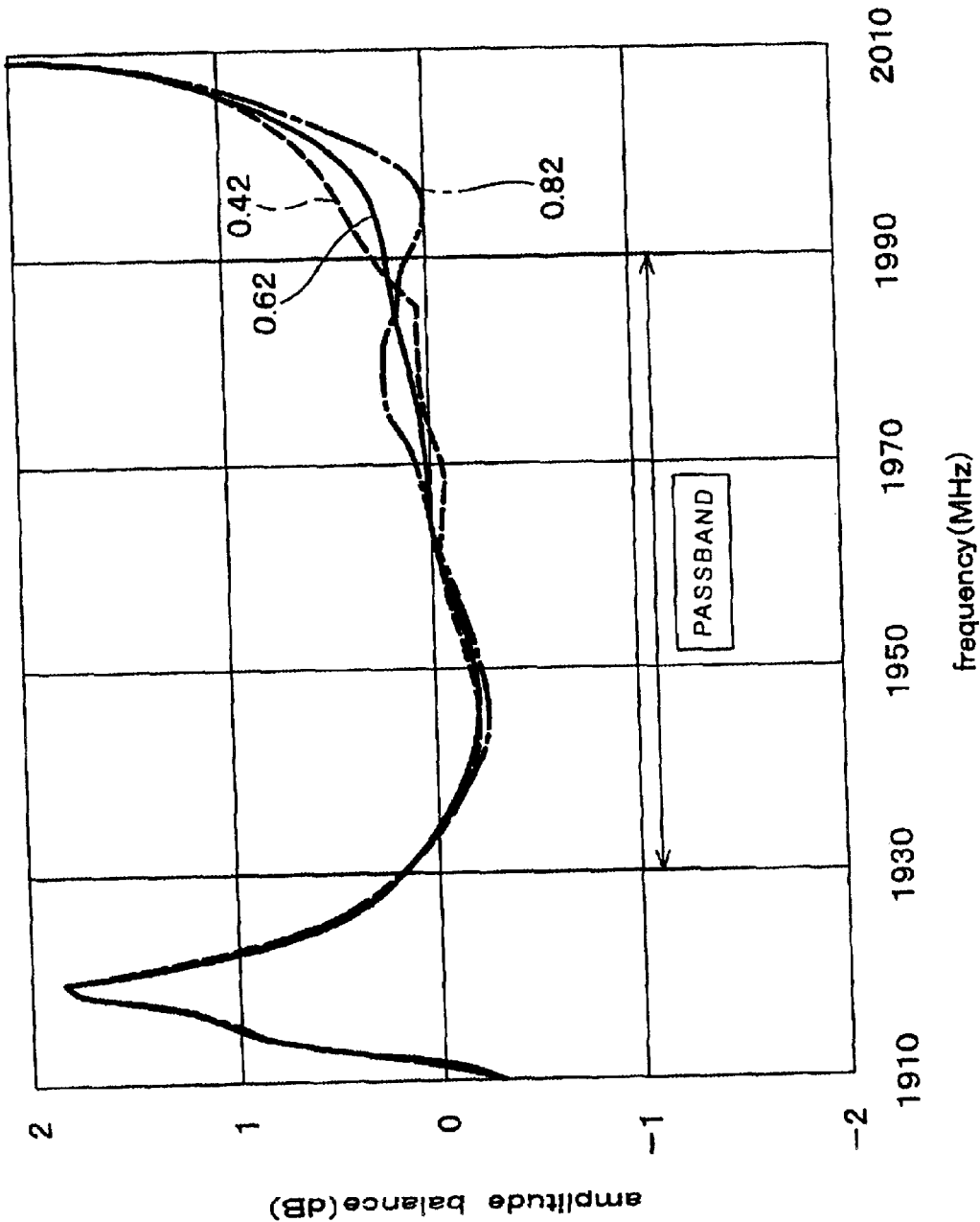
FIG. 6 is a graph showing the rate of change in amplitude when the duty in a resonator of a trapping resonator of the surface acoustic wave device is changed.
Figure 7:
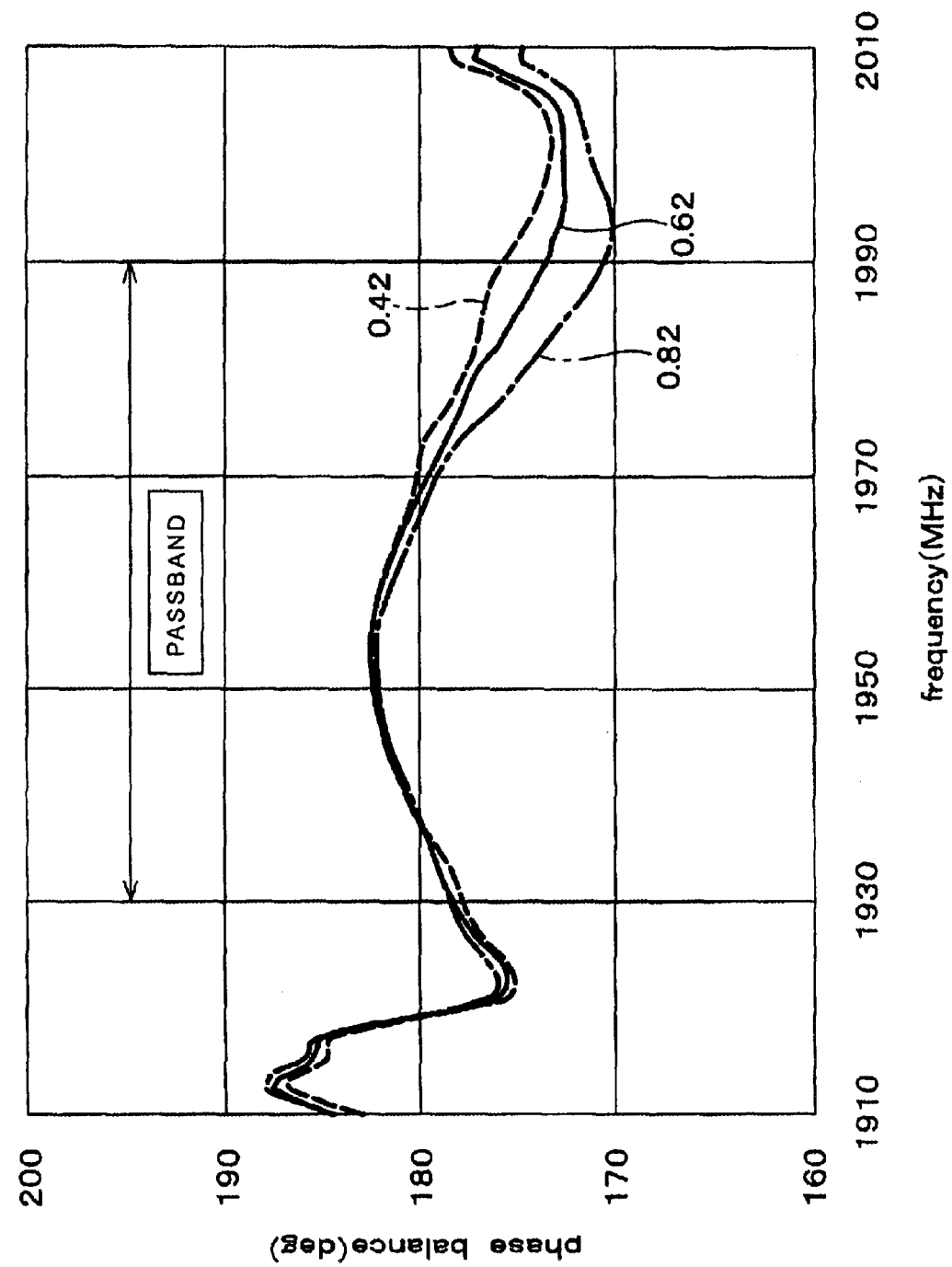
FIG. 7 is a graph showing the rate of change in phase when the duty in a resonator of a trapping resonator of the surface acoustic wave device is changed.

The changes of the balanced characteristics when duty of the trapping resonator 3 in the above-described surface acoustic wave device was changed of about 0.42, about 0.62, and about 0.82 are shown in FIGS. 6 and 7. FIG. 6 shows the degree of the amplitude balance, and FIG. 7 shows the degree of the phase balance. The duty of the trapping resonator 4 is approximately 0.62. $N_1$ is set at 337, and $N_2$ is set at 305. The other design parameters are identical to those shown in Table 1.

It can be seen from FIGS. 6 and 7 that, by changing the duty of the trapping resonator connected to the unbalanced signal terminal side, the balanced characteristics change. That is, although the balanced characteristics differ depending on the design of the resonator filter, the balanced characteristics can be adjusted at higher frequencies of the passband by changing the duty in the resonator in the trapping resonator connected to the unbalanced signal terminal side. It can be seen from, in particular, FIG. 7 that the phase balance can be adjusted.

In the foregoing, although the resonator filter preferably includes three IDTs, regardless of the design of this preferred embodiment, another configuration in which the resonator filter includes a plurality of IDTs, which is not limited to, for example, three, may also be used.

Second Preferred Embodiment

Figure 8:
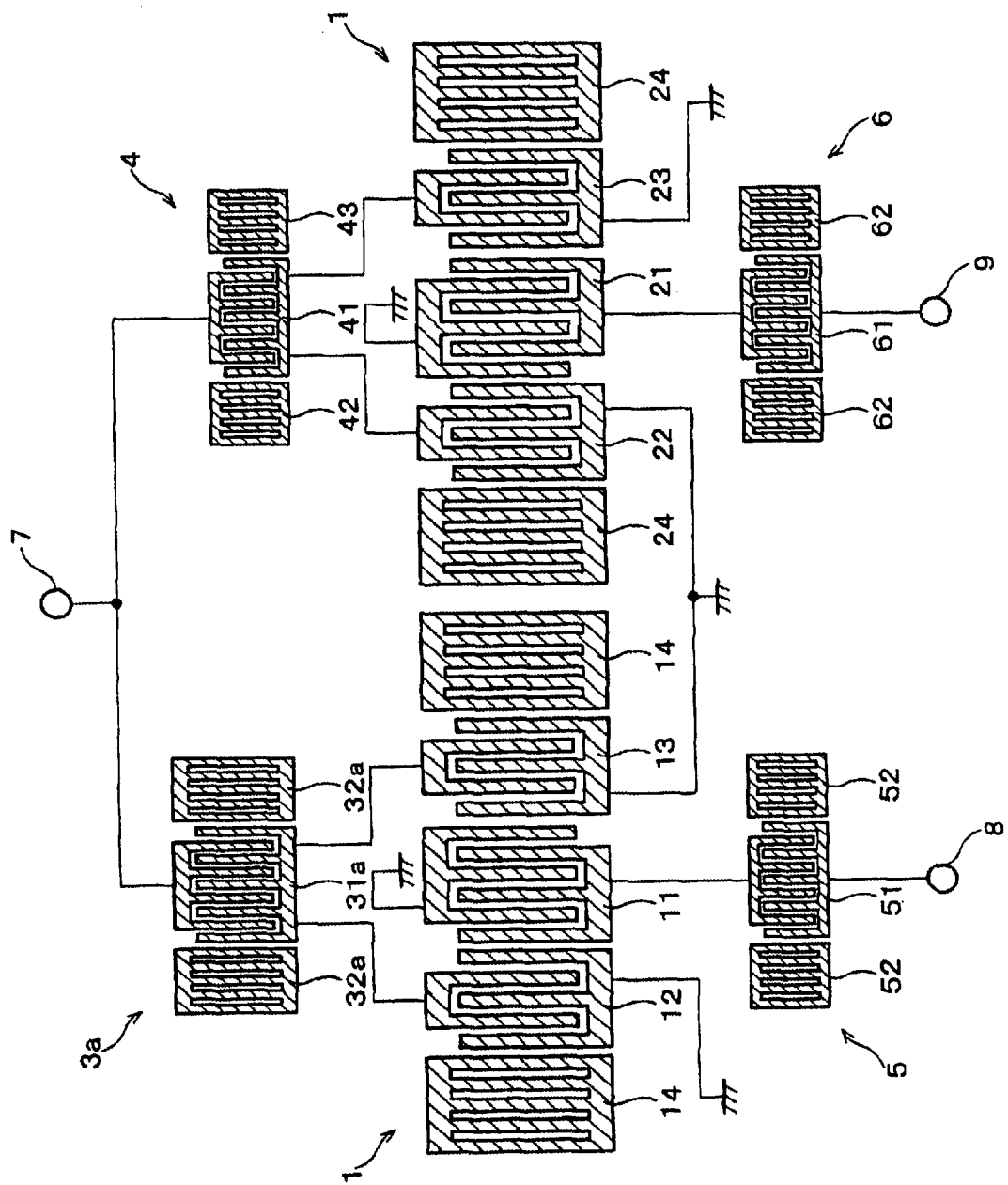
FIG. 8 is a schematic diagram of a surface acoustic wave device according to a second preferred embodiment of the present invention.

Another preferred embodiment of the present invention will now be described with reference to FIGS. 8 to 10. For the sake of description, components having the same function as the components shown in the first preferred embodiment are designated with the same reference numerals, and accordingly, descriptions thereof are omitted.

In this preferred embodiment, in the design which is substantially identical to that of the surface acoustic wave device of the first preferred embodiment, the trapping resonator 3 including a resonator 31 connected to the unbalanced signal terminal 7 side and the reflectors 32 and 32 which sandwich the resonator 31 is changed to a trapping resonator 31a including a resonator 32a and reflectors 32a and 32a which sandwich the resonator 31a. The finger overlap of the resonator 31 differs from that of the resonator 31a. In connection with the above, in order to study the balanced characteristics by the finger overlap in the resonators 3a and 4, a description will now be given by using a specific example. The design parameters in the surface acoustic wave device are shown in Table 3. The finger overlaps in the trapping resonators 3a and 4 are denoted as $A_1$ and $A_2$, respectively.

TABLE 3

|  | Trap 3a | Trap 4 |
| --- | --- | --- |
| Number of reflectors | 30 | 30 |
| Number of center IDTs | 321 | 321 |
| Finger overlap (μm) | $A_1$ | $A_2$ |
| Center frequency (MHz) | 1997 | 1997 |

Figure 9:
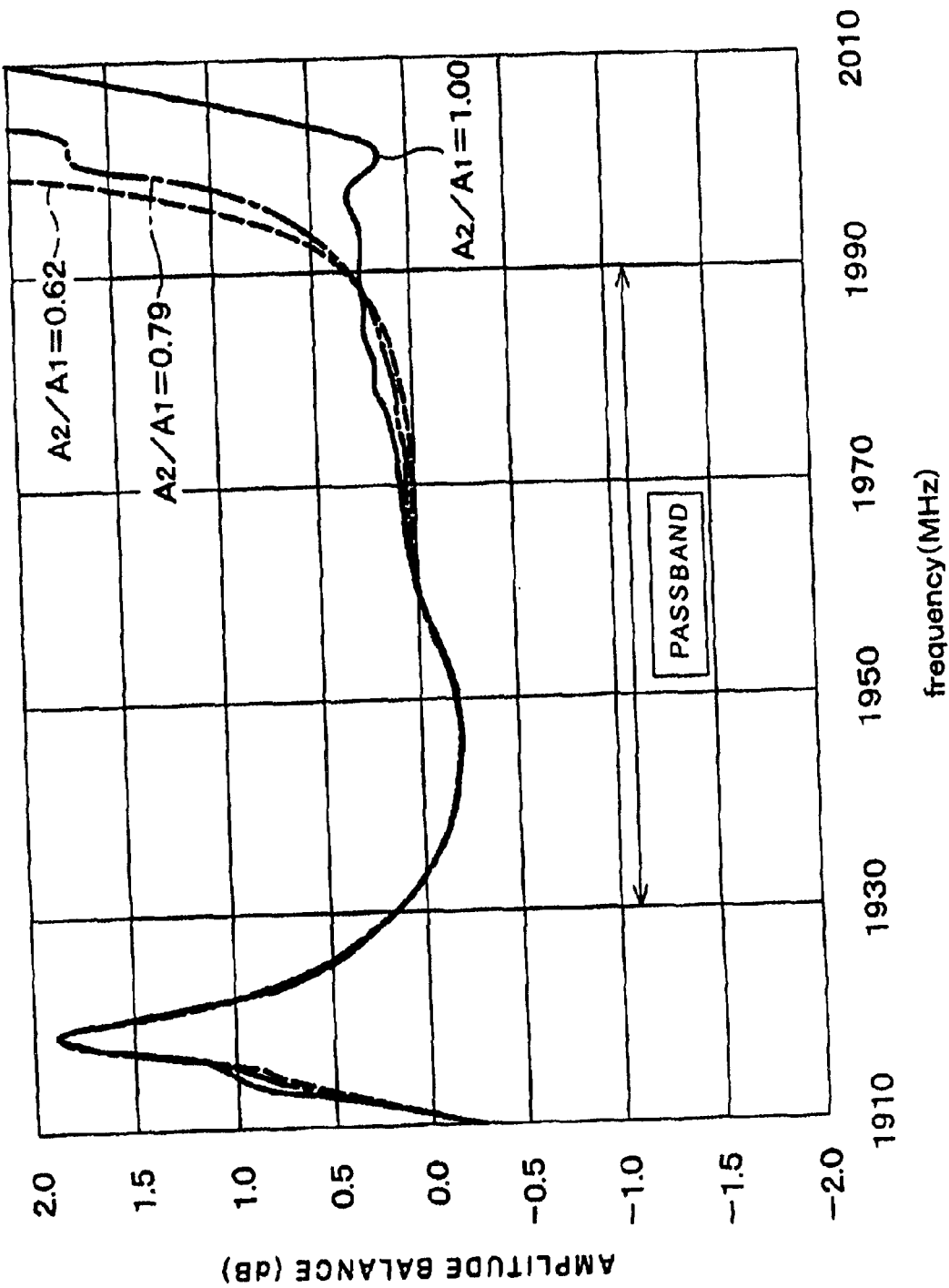
FIG. 9 is a graph showing the degree of the amplitude balance which is simulated by changing the finger overlap in a resonator of a trapping resonator of the surface acoustic wave device.
Figure 10:
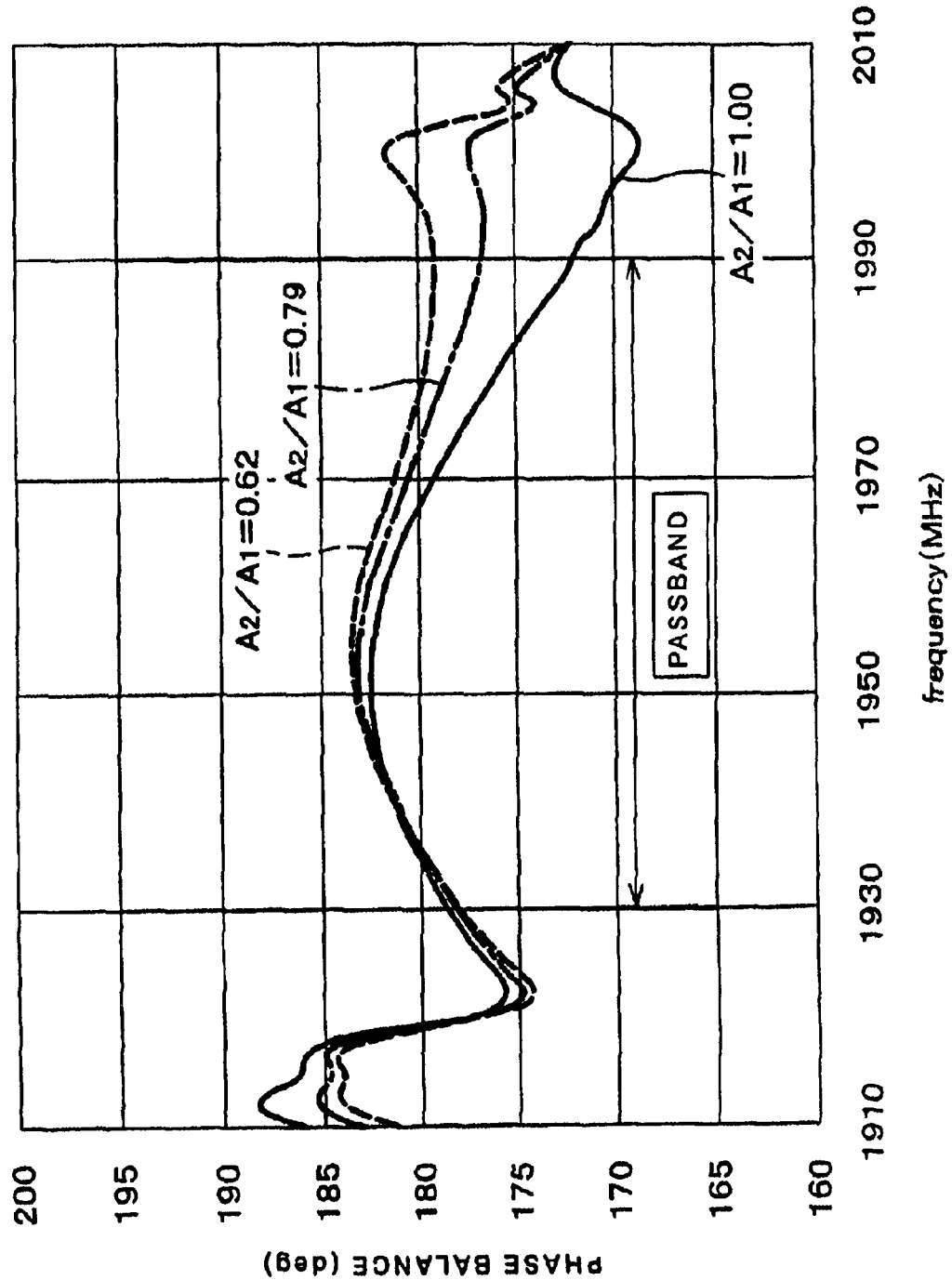
FIG. 10 is a graph showing the degree of the phase balance which is simulated by changing the finger overlap in a resonator of a trapping resonator of the surface acoustic wave device.

FIG. 9 shows changes in balanced characteristics when the finger overlap of a resonator in a trapping resonator connected to the unbalanced signal terminal side in a simplified simulation with regard to the degree of the amplitude balance of the surface acoustic wave device. FIG. 10 shows changes in balanced characteristics when the finger overlap of a resonator in a trapping resonator connected to the unbalanced signal terminal side in a simplified simulation with regard to the degree of the phase balance of the surface acoustic wave device. Here, the changes (characteristics) of the balanced characteristics when $A_2/A_1$ is about 1.0, about 0.79, and about 0.62 are shown. It can be seen from FIGS. 9 and 10 that the balanced characteristics can be adjusted at higher frequencies within the passband by changing the finger overlap of the resonator in the trapping resonator connected to the unbalanced signal terminal side in a manner similar to that in which the number of electrode fingers is changed.

In the manner described above, it is possible to adjust the balanced characteristics by making the design parameters of the trapping resonators connected to the unbalanced signal terminal side different from each other.

Furthermore, not only the number of electrode fingers, the duty, and the finger overlap, but also the pitch between resonators, the width of the electrode finger, or a method of weighting of the electrode fingers may also be used.

Third Preferred Embodiment

A third preferred embodiment of the present invention will now be described with reference to FIGS. 14 to 21.

Figure 14:
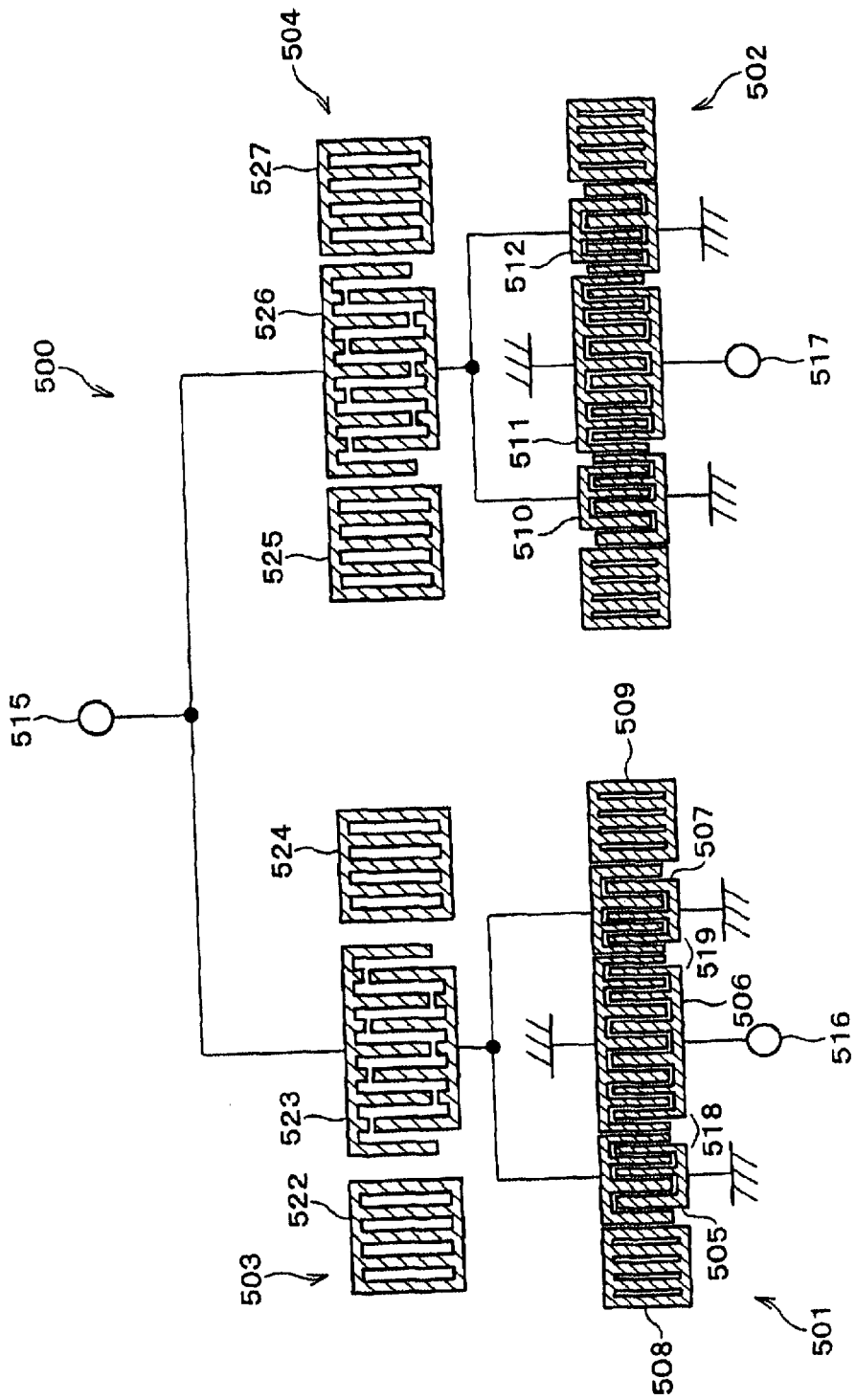
FIG. 14 is a schematic diagram of a surface acoustic wave device according to a third preferred embodiment of the present invention.

A surface acoustic wave device (SAW device) having an unbalanced-to-balanced conversion function according to this preferred embodiment includes, as shown in FIG. 14, longitudinally coupled resonator SAW filters (surface acoustic wave elements) 501 and 502, preferably formed from Al electrodes, are provided on a piezoelectric substrate (not shown) preferably formed from 40±5° Y-cut X-propagation $LiTaO_3$. The surface acoustic wave device has a balanced-to-unbalanced conversion function in which the impedance of the unbalanced signal terminal is about 50 Ω and the impedance of the balanced signal terminal is about 15 Ω. Surface acoustic wave resonators (resonators) 503 and 504 are connected in series between an unbalanced signal terminal 515 and the longitudinally coupled resonator SAW filters 501 and between the unbalanced signal terminal 515 and the longitudinally coupled resonator SAW filters 502, respectively.

In the longitudinally coupled resonator SAW filters 501, IDTs 505 and 507 are arranged to sandwich an IDT 506, and reflectors 508 and 509 are disposed on both sides thereof. As shown in FIG. 14, the pitch of several electrode fingers between the IDT 505 and the IDT 506 and between the IDT 506 and the IDT 507 is smaller than the pitch of the electrode fingers of the other portions of the IDT (narrow pitch electrode-fingers 518 and 519).

The longitudinally coupled resonator SAW filters 502 is configured such that IDTs 510 and 512 sandwich the IDT 511, and reflectors 513 and 514 are disposed on both sides thereof. Similarly to the longitudinally coupled resonator SAW filters 501, narrow pitch electrode-fingers 520 and 521 are provided between the IDT 510 and the IDT 511 and between the IDT 511 and the IDT 512. Furthermore, the orientation of the IDTs 510 and 512 of the longitudinally coupled resonator SAW filters 502 is reversed relative to the direction of the finger overlap with respect to the IDT 505 and the IDT 507 of the longitudinally coupled resonator SAW filters 501. As a result, the phase of the output signal with respect to the input signal in the longitudinally coupled resonator SAW filters 502 is reversed by approximately 180° with respect to the longitudinally coupled resonator SAW filters 501.

In this preferred embodiment, the IDTs 506 and 511 of the longitudinally coupled resonator SAW filters 501 and 502 are connected to the balanced signal terminals 516 and 517, respectively. Furthermore, the IDTs 505 and 507 of the longitudinally coupled resonator SAW filters 501 are connected to the unbalanced signal terminal 515 via the surface acoustic wave resonator 503, and the IDTs 510 and 512 of the longitudinally coupled resonator SAW filters 502 are connected to the unbalanced signal terminal 515 via the surface acoustic wave resonator 504.

The surface acoustic wave resonators 503 and 504 are preferably configured identically, and reflectors 522 and 525, and reflectors 524 and 527 are arranged so as to sandwich the IDTs 523 and 526, respectively.

Figure 15:
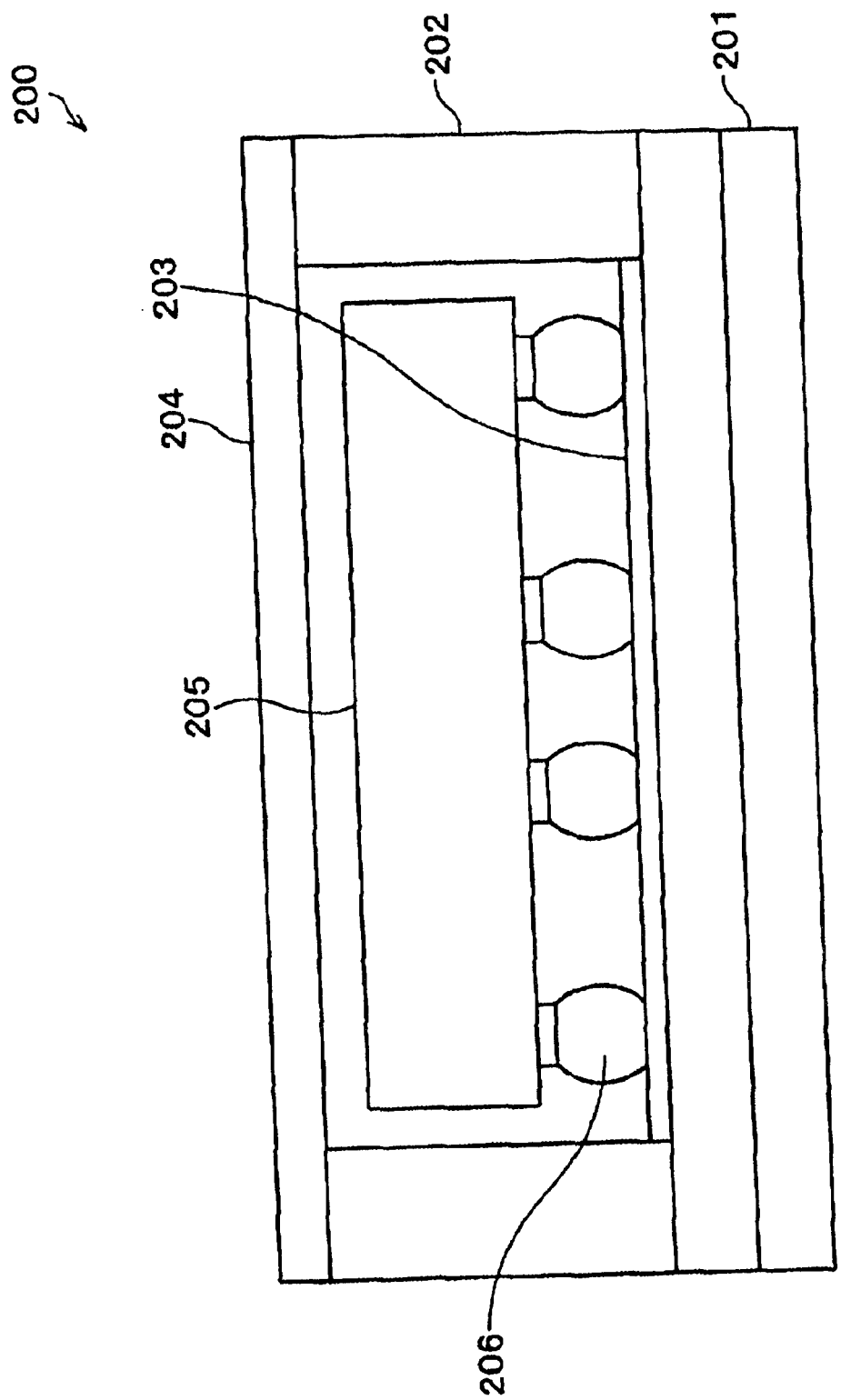
FIG. 15 is a sectional view of the essential portion of the surface acoustic wave device according to a preferred embodiment of the present invention, which is housed in a package.

Next, the sectional view of a surface acoustic wave device housed in a package in this preferred embodiment is shown in FIG. 15. The surface acoustic wave device is manufactured preferably by a flip-chip technique of making conduction between the package and a piezoelectric substrate 205 having a surface acoustic wave filter disposed thereon by bump bonding 206.

The package preferably has a two-layer structure, and includes a bottom plate 201, side walls 202, a die-attach member 203, and a cap 204. This bottom plate 201 preferably has, for example, a substantially rectangular shape, and the side walls 202 are arranged in a standing manner from the four peripheral portions of the bottom plate 201 correspondingly. The cap 204 covers and seals the opening formed by the side walls 202. On the top surface (inner surface) of the bottom plate 201, the die-attach member 203 for making conduction with the piezoelectric substrate 205 is disposed. The piezoelectric substrate 205 and the die-attach section 203 are coupled by a bump 206.

In the surface acoustic wave device 500 according to this preferred embodiment, the distance $X\lambda$ between the centers of adjacent electrode fingers of each of the reflectors 522 and 524 and the IDT 523 in the surface acoustic wave resonator 503 differs from the distance $Y\lambda$ between the centers of adjacent electrode fingers of each of the reflectors 525 and 527 and the IDT 526 in the surface acoustic wave resonator 504. That is, the distance between the centers of the outermost electrode fingers of the IDT and the reflector differs between the surface acoustic wave resonators 503 and 504. $\lambda$ is a wavelength determined by the electrode-finger pitch in the IDT of the surface acoustic wave filter. For example, in the surface acoustic wave resonator 503, $X\lambda$=about $0.57\lambda$, and in the surface acoustic wave resonator 504, $Y\lambda$=about $0.43\lambda$.

A detailed example of the design of the longitudinally coupled resonator SAW filters 501 and 502 according to this preferred embodiment is described below.

If the wavelength determined by the pitch of the electrode fingers in which the pitch of the electrode fingers is not made narrow is denoted as $\lambda I$:

the finger overlap: about $41.8\lambda I$, the number of IDTs: (in the order of the IDT 505, the IDT 506, and the IDT 507): 18(3)/(3)33(3)/(3)18 (the numerals within the parentheses indicate the number of electrode fingers in which the pitch is narrow), the number of reflectors: 60 (reflectors 508 and 509), 90 (reflectors 513 and 514), the duty: about 0.72 (IDT), about 0.57 (reflector), and the thickness of the electrode film: about $0.092\lambda I$.

A detailed example of the design of the surface acoustic wave reflectors 503 and 504 is described below:

the finger overlap: about $16.5\lambda I$, the number of IDTs: 180, the number of reflectors: 15, the duty: about 0.60, and the thickness of the electrode film: about $0.093\lambda I$.

Figure 18:
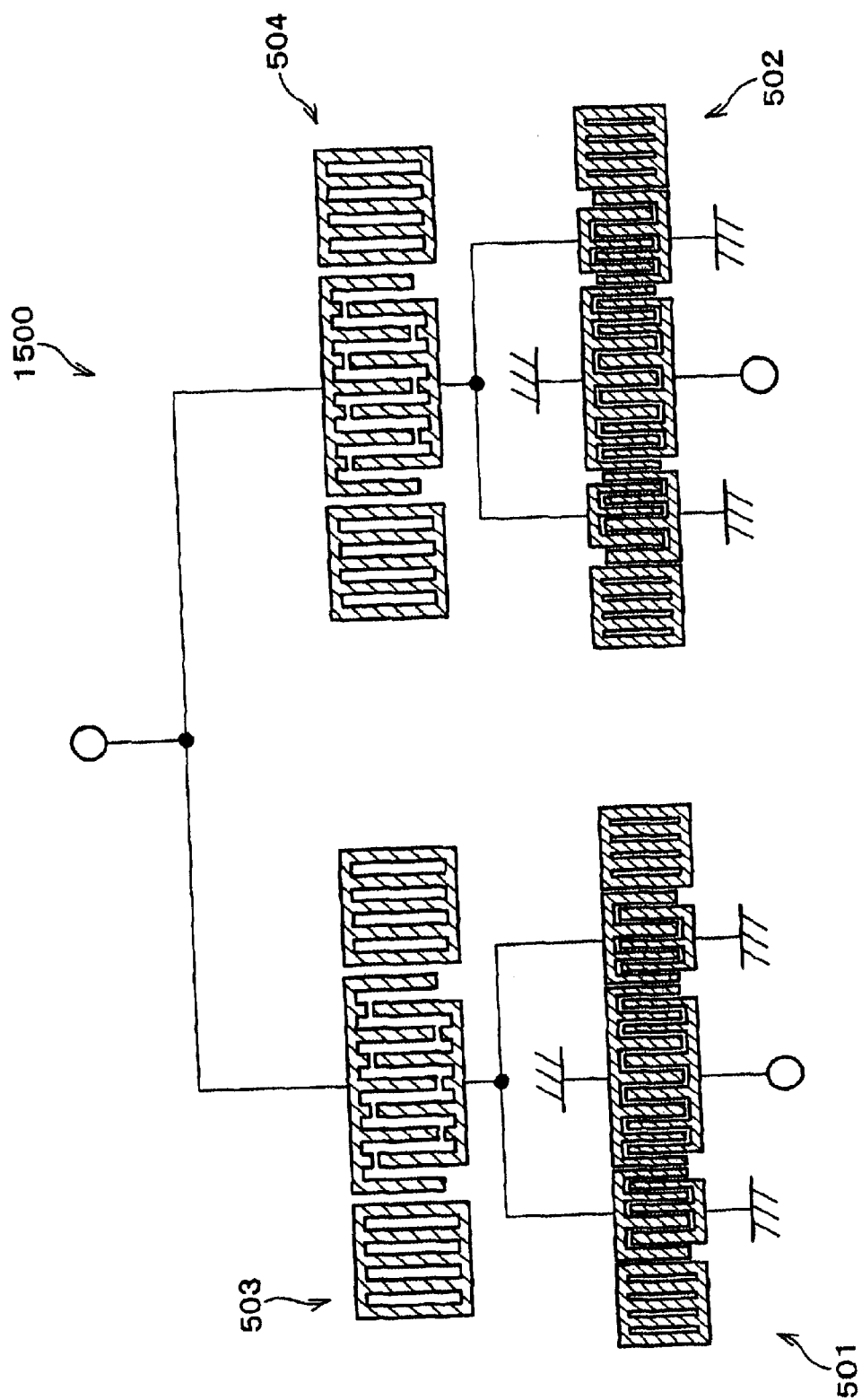
FIG. 18 is a schematic diagram of the surface acoustic wave device of comparative example 1.

For the comparison with respect to the surface acoustic wave device 500 according to this preferred embodiment, the configuration of a surface acoustic wave device 1500 of comparative example 1 is shown in FIG. 18. As compared to the surface acoustic wave device 500, this surface acoustic wave device 1500 is configured in such a manner that the distance $X\lambda$ between the centers of adjacent electrode fingers (the outermost electrode-finger center-to-center distance) of each of the reflectors 522 and 524 and the IDT 523 in the surface acoustic wave resonator 503 is about $0.50\lambda$, and the distance $Y\lambda$ between the centers of adjacent electrode fingers (the outermost electrode-finger center-to-center distance) of each of the reflectors 525 and 527 and the IDT 526 in the surface acoustic wave resonator 504 is about $0.50\lambda$. The other design parameters are identical to those of the surface acoustic wave device 500.

Figure 16:
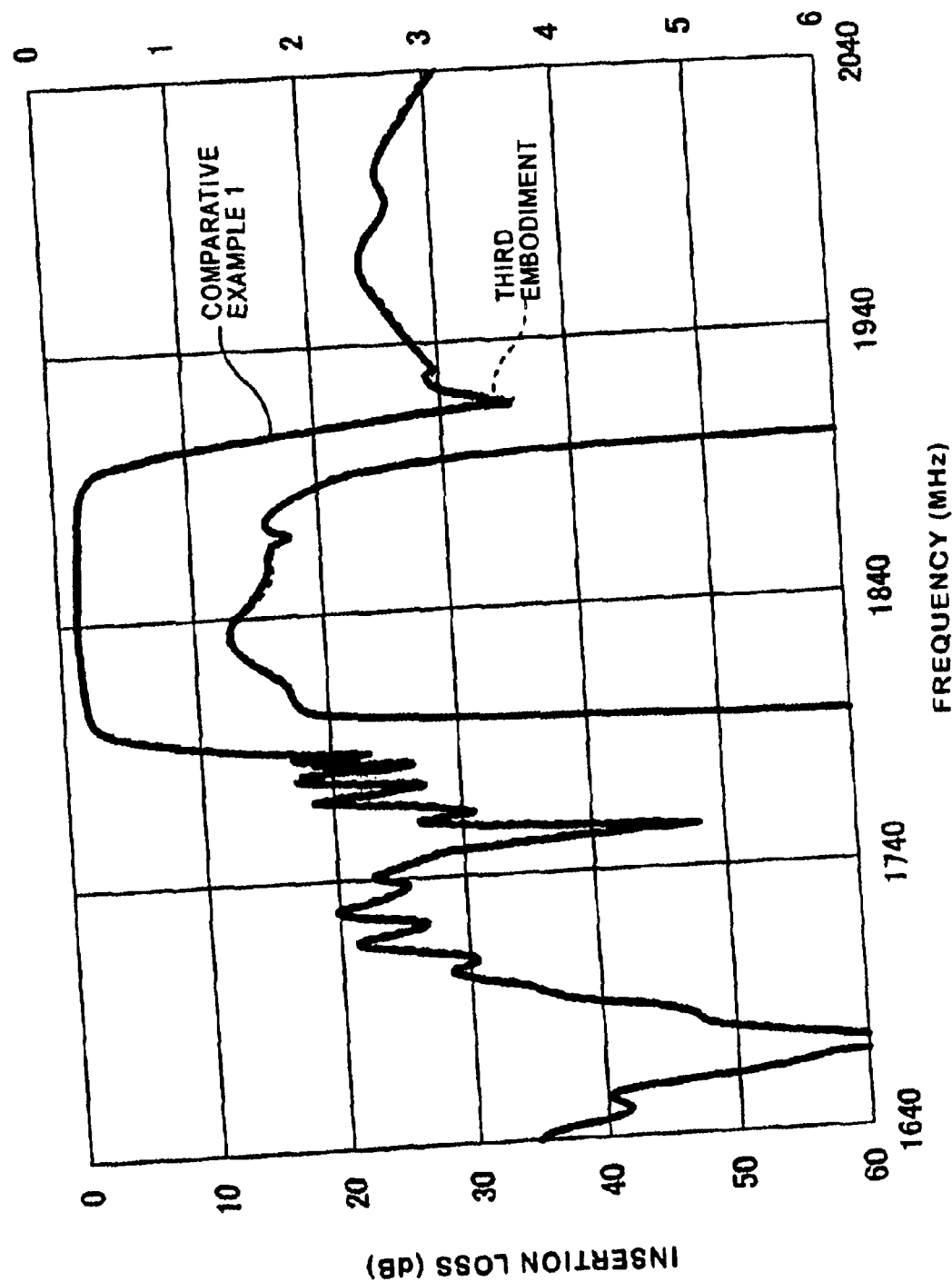
FIG. 16 is a graph showing SAW frequency-insertion loss characteristic in the surface acoustic wave device according to the third preferred embodiment of the present invention and a surface acoustic wave device of comparative example 1.
Figure 17:
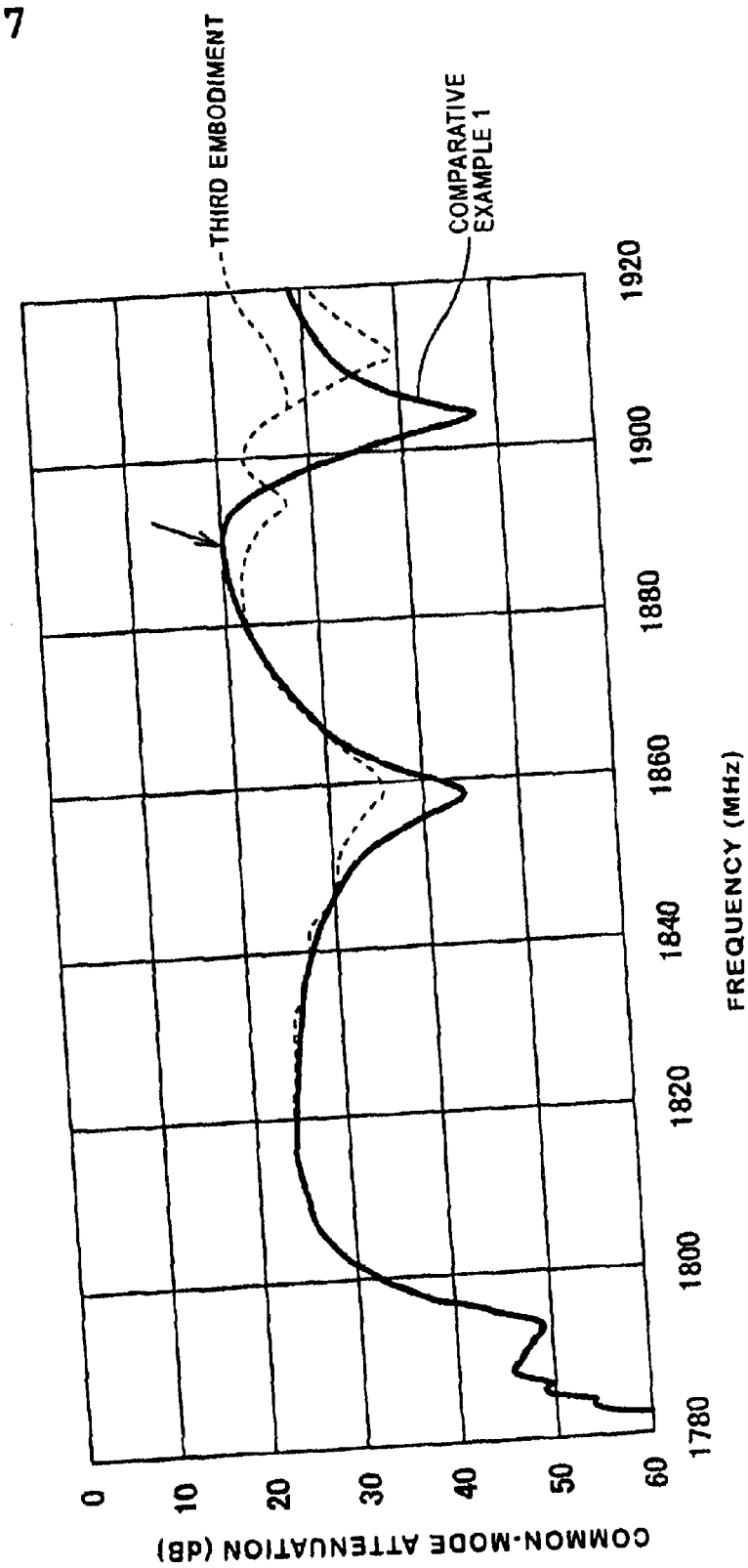
FIG. 17 is a graph showing frequency-common-mode attenuation characteristics in the surface acoustic wave device according to the third preferred embodiment of the present invention and the surface acoustic wave device of comparative example 1.

FIGS. 16 and 17 show frequency-insertion loss characteristics, and frequency-common-mode attenuation characteristics in the surface acoustic wave device 500 according to this preferred embodiment. FIGS. 16 and 17 also show frequency-insertion loss characteristics, and frequency-common-mode attenuation characteristics in the surface acoustic wave device 1500 of comparative example 1.

When FIG. 17 is viewed, in the surface acoustic wave device 500 according to this preferred embodiment, the common-mode attenuation in the vicinity of 1880 MHz to 1900 MHz is approximately 22 dB, whereas in the surface acoustic wave device 1500 of comparative example 1, the common-mode attenuation is approximately 20 dB. That is, it can be seen that this common-mode attenuation is improved by approximately 2 dB. At this time, a large deterioration of the common-mode attenuation does not occur. Furthermore, as can be seen by viewing FIG. 16, a deterioration of insertion loss within the passband does not occur. This is due to the effect that, since the distance $X\lambda$ between the centers of adjacent electrode fingers of each of the reflectors 522 and 524 and the IDT 523 in the surface acoustic wave resonator 503 differs from the distance $Y\lambda$ between the centers of adjacent electrode fingers of each of the reflectors 525 and 527 and the IDT 526 in the surface acoustic wave resonator 504, the amplitude and phase characteristics in the surface acoustic wave resonator 503 differ from those in the surface acoustic wave resonator 504, and the deviation of the degree of the balance at higher frequencies of the passband in the longitudinally coupled resonator SAW filters 501 and 502 is corrected.

Figure 19:
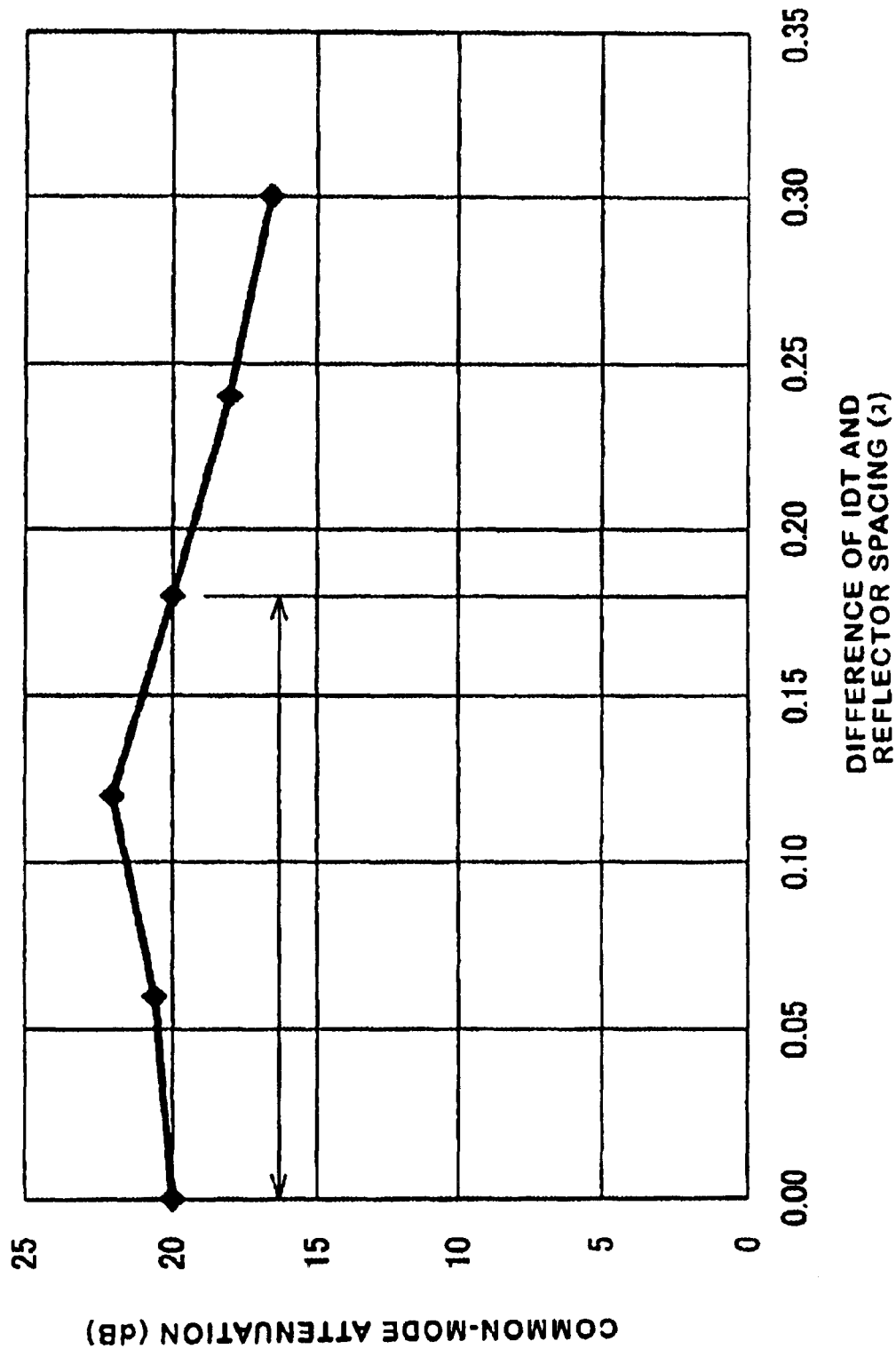
FIG. 19 is a graph in which the range in which the effects of the surface acoustic wave device according to the third preferred embodiment of the present invention are obtained is checked.

Next, the range in which the common-mode attenuation is improved was studied. The study was made in such a manner that the distance $X\lambda$ between the centers of adjacent electrode fingers of each of the reflectors 522 and 524 and the IDT 523 in the surface acoustic wave resonator 503, and the distance $Y\lambda$ between the centers of adjacent electrode fingers of each of the reflectors 525 and 527 and the IDT 526 in the surface acoustic wave resonator 504 are changed, and the common-mode attenuation at 1880 MHz to 1900 MHz with respect to the difference therebetween was checked. The results are shown in FIG. 19. It can be seen from FIG. 19 that, until the difference between $X\lambda$ and $Y\lambda$ is about $0.18\lambda$, common-mode attenuation which is larger than that in a case where $X\lambda$ and $Y\lambda$ are not made different (made identical) is obtained. That is, it can be seen that, in the surface acoustic wave device 500, preferably, $(0+0.5 n)\lambda < |X-Y|\lambda \leq (0.18+0.5 n)\lambda$, where n=0, 1, 2 . . .

As described in the foregoing, in the third preferred embodiment, in the surface acoustic wave device having a balanced-to-unbalanced conversion function by using two longitudinally coupled resonator SAW filters 501 and 502 in which surface acoustic wave resonators are connected in series, the surface acoustic wave resonators 503 and 504 are connected in series between the longitudinally coupled resonator SAW filters 501 and 502, and the balanced signal terminal 515, respectively, and the distance between the centers of the outermost electrode fingers of the IDT and the reflector in each of the surface acoustic wave resonators 503 and 504 is made different. As a result, a surface acoustic wave device having a large common-mode attenuation at higher frequencies of the passband is obtained.

Although in this preferred embodiment, an example is described in which two longitudinally coupled resonator SAW filters having three IDTs are used, two longitudinally coupled resonator SAW filters having five IDTs may be used. Furthermore, even when a surface acoustic wave device having a balanced-to-unbalanced conversion function is constructed by using one longitudinally coupled resonator SAW filter, a surface acoustic wave device having a large common-mode attenuation at higher frequencies of the passband is obtained by making the distances between the centers of the outermost electrode fingers of the IDT and the reflectors of the surface acoustic wave resonator different.

In this preferred embodiment, as shown in FIG. 15, a surface acoustic wave device was manufactured by a method of making conduction between the package 200 and each electrode pad on the piezoelectric substrate 205 by a face-down mounting technique using a bump-bonding technique. However, a wire-bonding technique or other suitable technique may be used.

Figure 20:
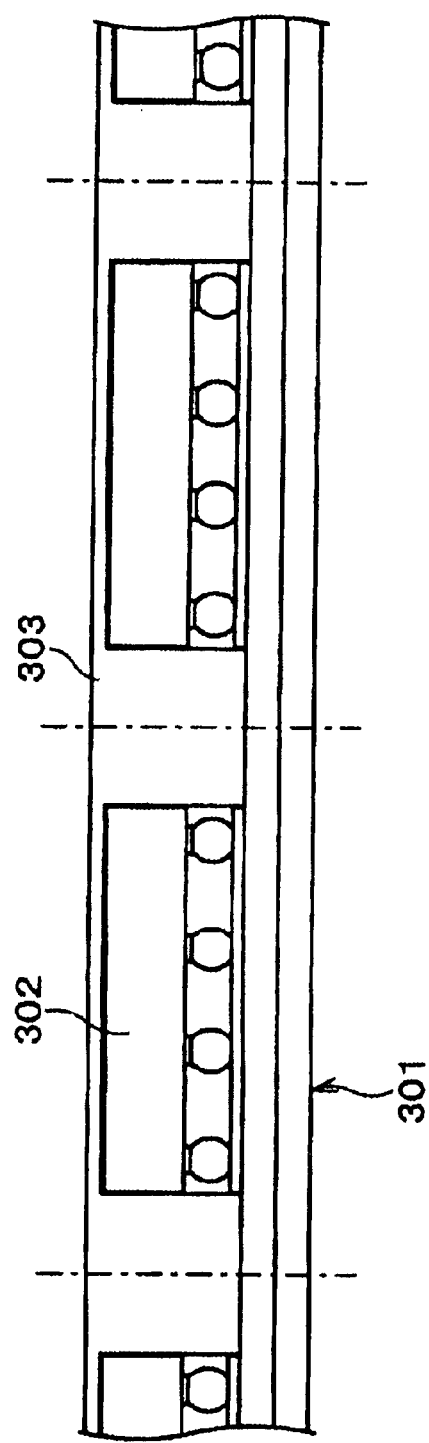
FIG. 20 is a sectional view showing a manufacturing process for the surface acoustic wave device of the preferred embodiments of the present invention.
Figure 21:
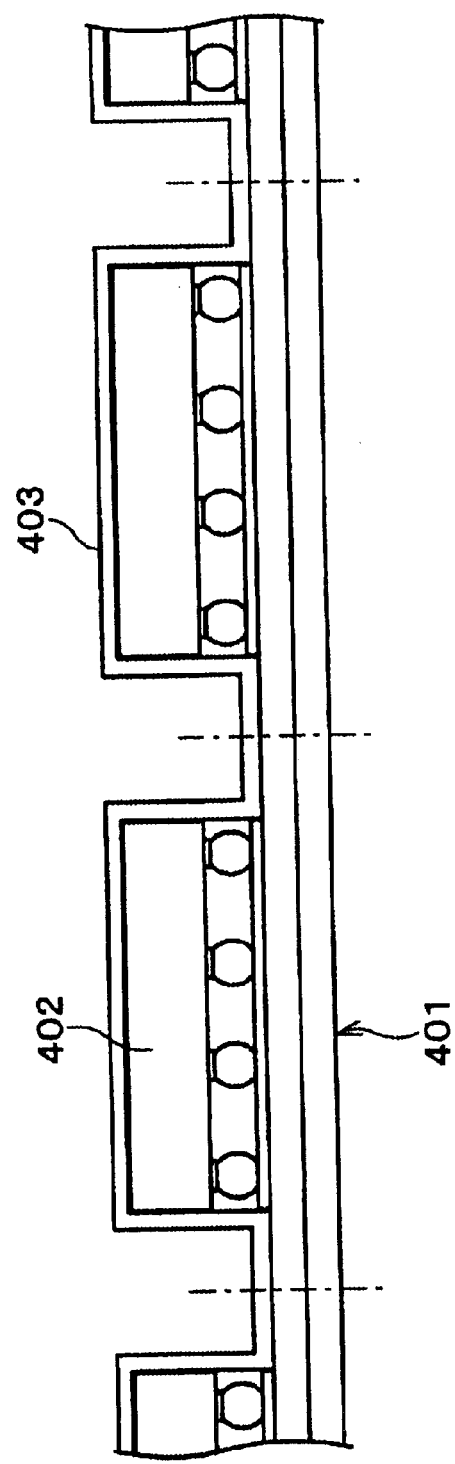
FIG. 21 is a sectional view showing another manufacturing process for the surface acoustic wave device of the preferred embodiments of the present invention.
Figure 22:
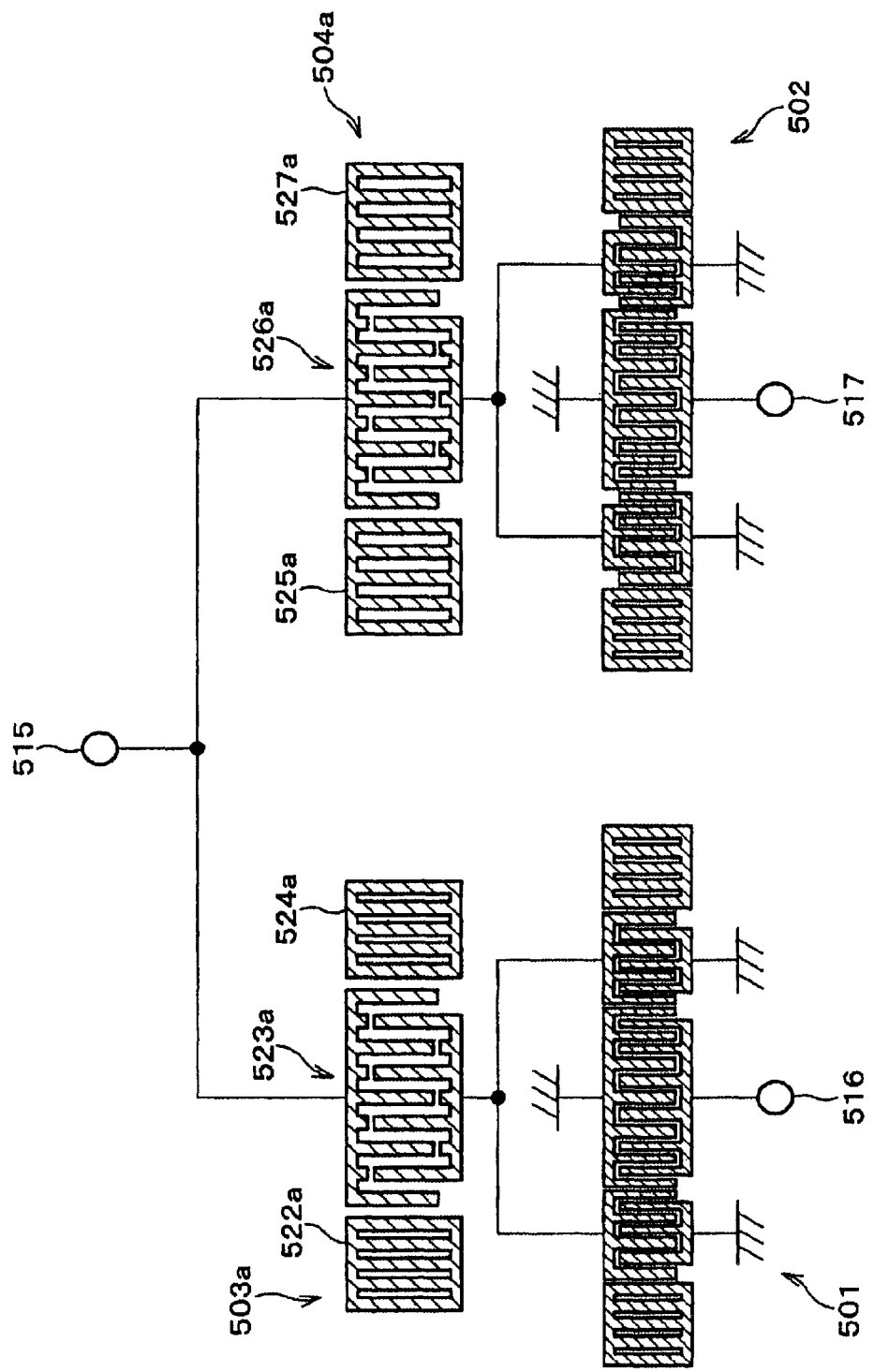
FIG. 22 is a schematic diagram of a surface acoustic wave device according to a fourth preferred embodiment of the present invention.

For the configuration in which the surface acoustic wave device is manufactured by a face-down mounting technique, in addition to the configuration of FIG. 15, the surface acoustic wave device may be manufactured by a configuration in which, for example, as shown in FIG. 20, a piezoelectric substrate 302 is bonded onto a clustered substrate 301 by a flip-chip technique, this is sealed by covering with a resin 303, and this is cut in units of one package by dicing, or by a configuration in which, as shown in FIG. 21, similarly, a piezoelectric substrate 402 is bonded onto a clustered substrate 401 by a flip-chip technique, this is sealed by covering with a resin 403, and this is cut in units of one package by dicing.

Although in this preferred embodiment, a piezoelectric substrate formed from 40±5° Y-cut X-propagation LiTaO$_3$ is preferably used, in the present invention, as can be understood from the principle from which the effect is obtained, in addition to this piezoelectric substrate, the same advantages can be obtained by a piezoelectric substrate, such as, for example, 64° to 72° Y-cut X-propagation LiNbO$_3$ or 41° Y-cut X-propagation LiNbO$_3$.

Fourth Preferred Embodiment

A fourth preferred embodiment of the present invention will now be described with reference to FIGS. 22 to 25. For the sake of description, components having the same function as that of the components shown in the third preferred embodiment are designated with the same reference numerals, and accordingly, descriptions thereof are omitted.

A surface acoustic wave device 500a according to this preferred embodiment is configured in such a manner that, in the surface acoustic wave device 500 of the third preferred embodiment, instead of the surface acoustic wave resonators 503 and 504, surface acoustic wave resonators 503a and 504a are preferably used. The surface acoustic wave resonators 503a and 504a are arranged in such a manner that reflectors 522a and 525a, and reflectors 524a and 527a sandwich IDTs 523a and 526a, respectively. In the surface acoustic wave resonators 503a and 504a, the ratio "a" of the pitch of the IDT 523a to the pitch of the reflectors 522a and 524a in the surface acoustic wave resonator 503a differs from the ratio "b" of the pitch of the IDT 526a to the pitch of the reflectors 525a and 527a in the surface acoustic wave resonator 504a. The pitch ratio is represented as "IDT pitch/reflector pitch". The pitch ratios of the IDT to the reflector in the surface acoustic wave resonators 503a and 504a are preferably a=about 0.994 and b=about 1.006, respectively. The other design parameters in the surface acoustic wave device 500a are preferably identical to those of the surface acoustic wave device 1500 of comparative example 1 described above.

Figure 23:
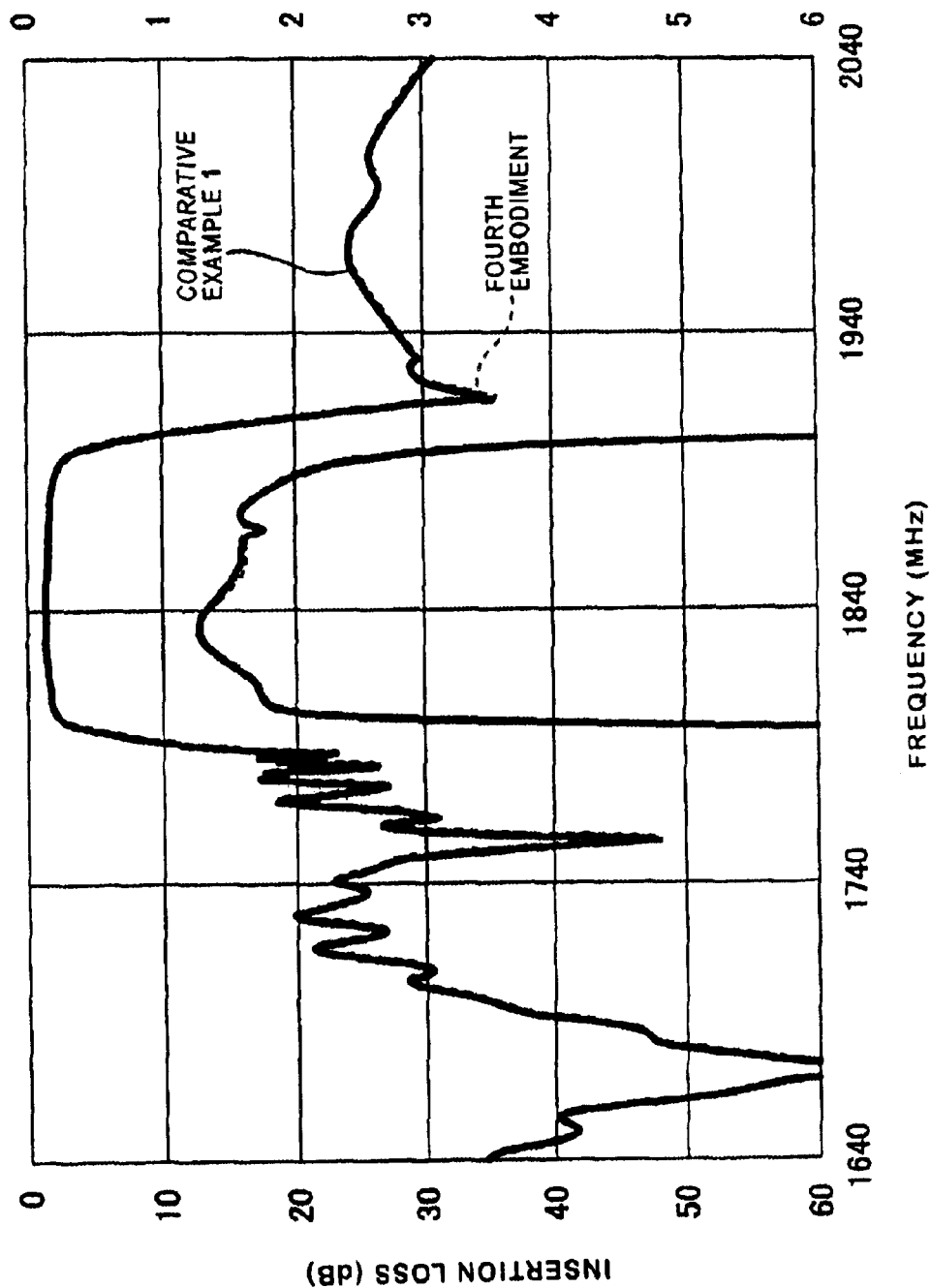
FIG. 23 is a graph showing SAW frequency-insertion loss characteristics in the surface acoustic wave device according to the fourth preferred embodiment of the present invention and the surface acoustic wave device of comparative example 1.
Figure 24:
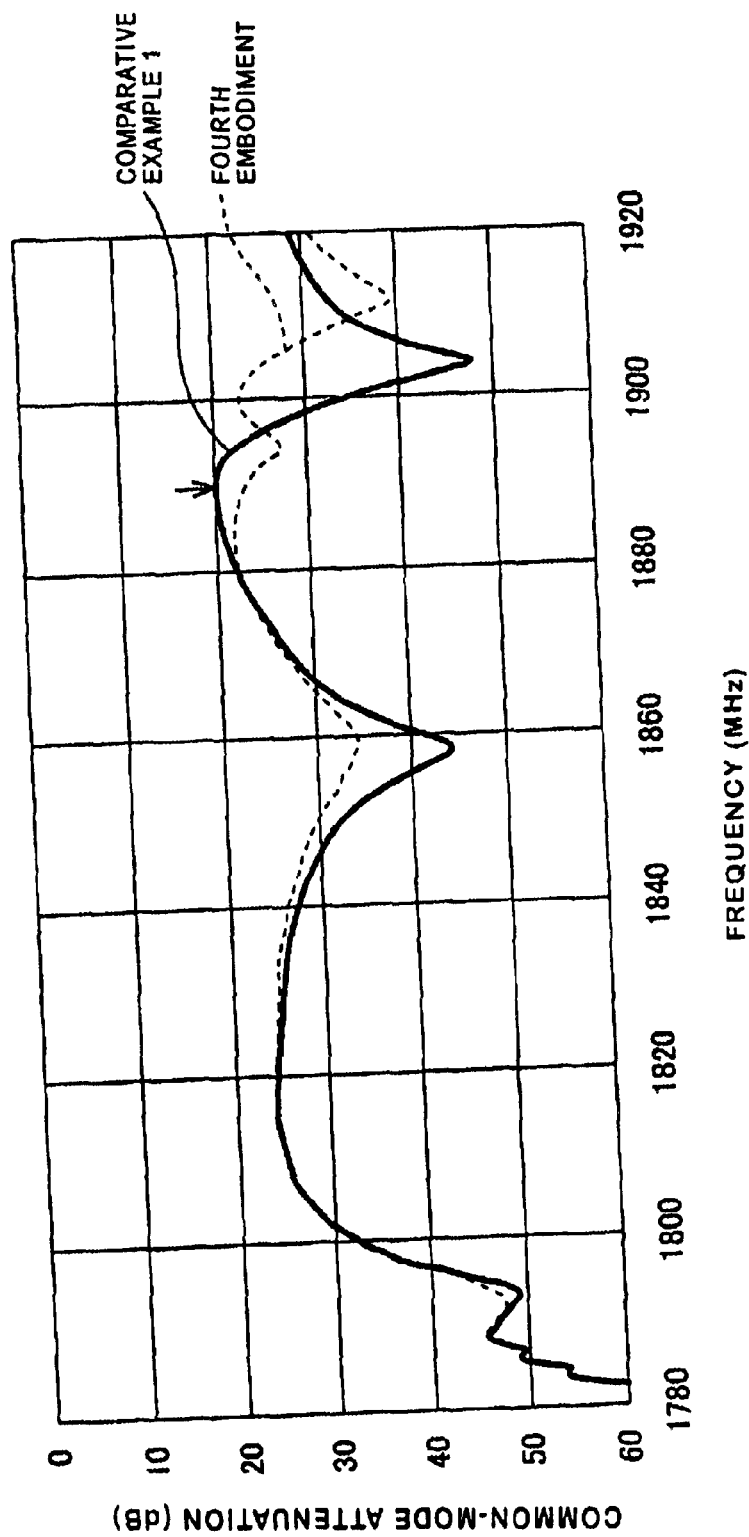
FIG. 24 is a graph showing frequency-common-mode attenuation characteristics in the surface acoustic wave device according to the fourth preferred embodiment of the present invention and the surface acoustic wave device of comparative example 1.

FIGS. 23 and 24 show frequency-insertion loss characteristics, and frequency-common-mode attenuation characteristics in the surface acoustic wave device 500a according to this preferred embodiment. FIGS. 23 and 24 also show frequency-insertion loss characteristics, and frequency-common-mode attenuation characteristics in the surface acoustic wave device 1500 of comparative example 1.

When FIG. 24 is viewed, in the surface acoustic wave device 500a according to this preferred embodiment, the common-mode attenuation in the vicinity of 1880 MHz to 1900 MHz is approximately 22 dB, whereas in the surface acoustic wave device 1500 of comparative example 1, the common-mode attenuation is approximately 20 dB. That is, it can be seen that this common-mode attenuation is improved by approximately 2 dB. At this time, a large deterioration of the common-mode attenuation within the passband does not occur. Furthermore, as can be seen by viewing FIG. 23, a deterioration of insertion loss within the passband also does not occur. This is due to the effect that, since the pitch ratio of the IDT to the reflector is made different in the surface acoustic wave device 503a and the surface acoustic wave device 504a, the amplitude and phase characteristics in the surface acoustic wave device 503a and the surface acoustic wave device 504a differ, and the deviation of the degree of balance at higher frequencies of the passband in the longitudinally coupled resonator SAW filters 501 and 502 is corrected.

Figure 25:
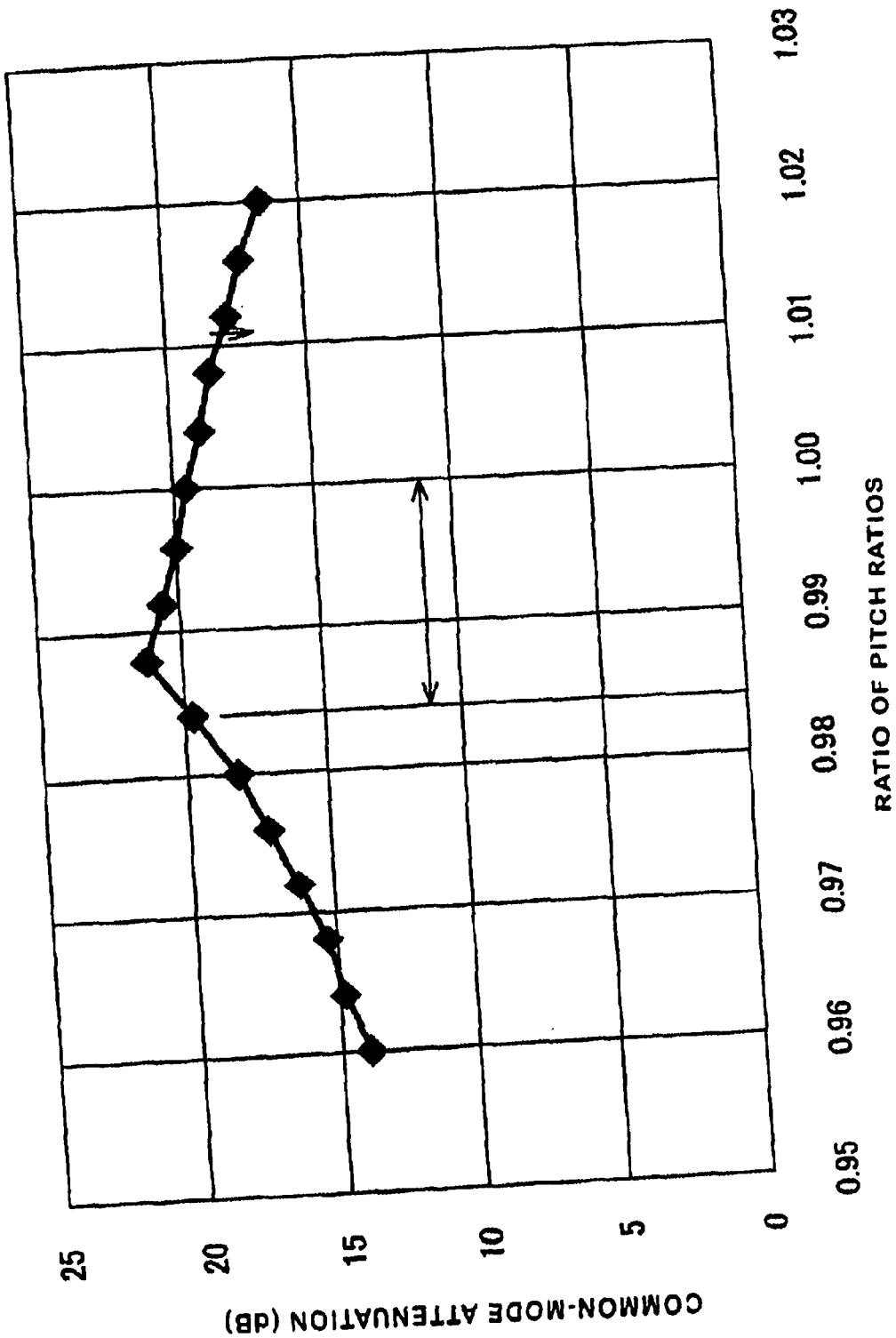
FIG. 25 is a graph in which the range in which the advantages of the surface acoustic wave device according to the fourth preferred embodiment of the present invention are obtained is checked.
Figure 26:
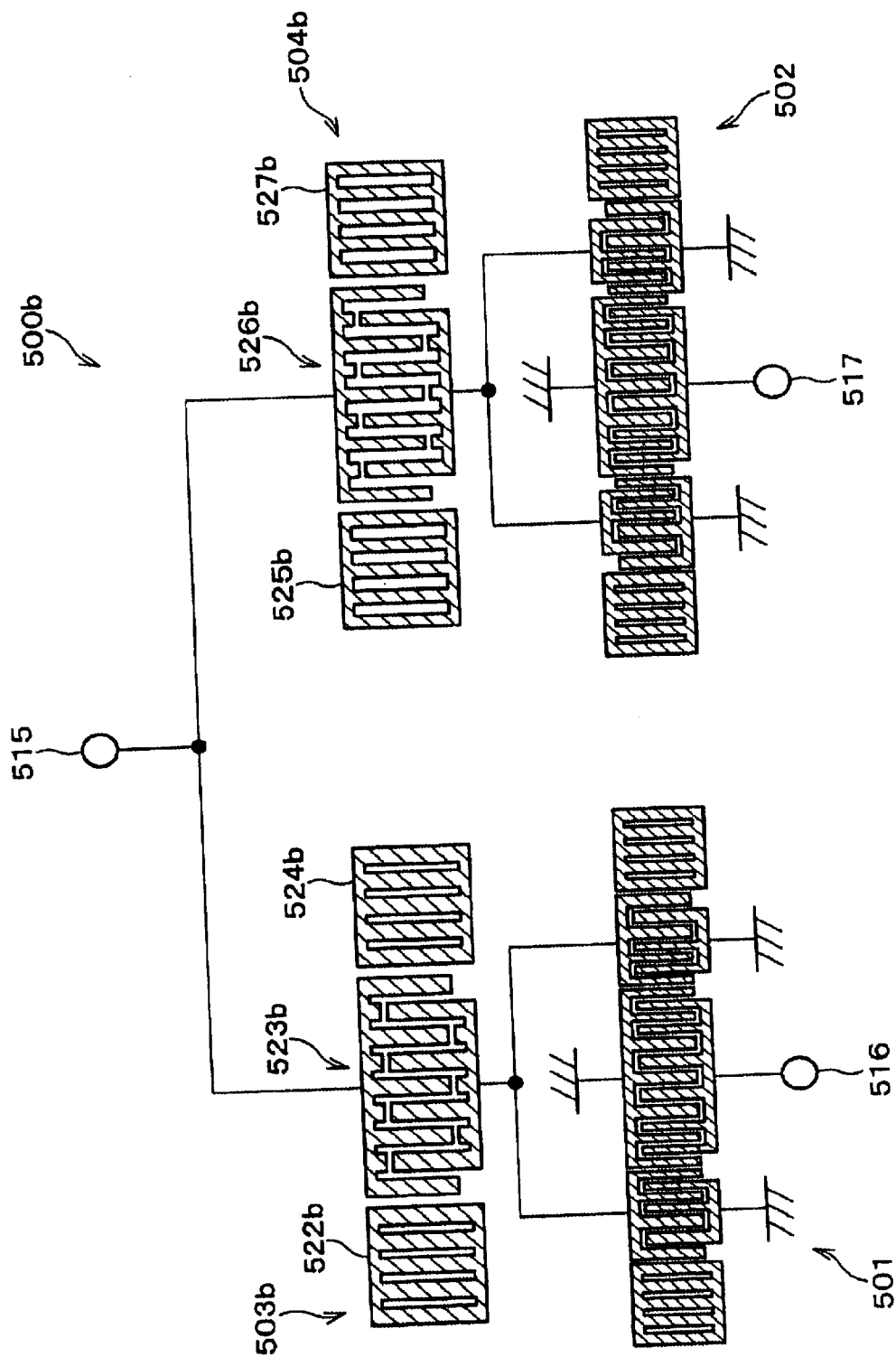
FIG. 26 is a schematic diagram of a surface acoustic wave device according to a fifth preferred embodiment of the present invention.

Next, the range in which the common-mode attenuation is improved was studied. The study was made in such a manner that the pitch ratio (a) of the IDT 523a to the reflectors 522a and 524a in the surface acoustic wave resonator 503a and the pitch ratio (b) of the IDT 526a to the reflectors 524a and 527a in the surface acoustic wave resonator 504a are changed, and the common-mode attenuation at 1880 MHz to 1900 MHz with respect to the ratio of the pitch ratios (the pitch ratio of the surface acoustic wave resonator 503a/the pitch ratio of the surface acoustic wave resonator 504a (a/b)) was checked. The results are shown in FIG. 25. It can be seen from FIG. 25 that, until the ratio of the pitch ratios is approximately 0.984, common-mode attenuation which is larger than that in a case where the pitch ratio is not made different is obtained. That is, in the surface acoustic wave device 500, it can be seen that, preferably, the ratio of the pitch ratios is in the range of approximately $0.984 \leq a/b < 1$.

As described in the foregoing, in the fourth preferred embodiment, in a surface acoustic wave device having a balanced-to-unbalanced conversion function by using two longitudinally coupled resonator SAW filters 501 and 502 in which surface acoustic wave resonators are connected in series, the surface acoustic wave resonators 503a and 504a are connected in series between the longitudinally coupled resonator SAW filters 501 and the balanced signal terminal

515 and between the longitudinally coupled resonator SAW filters 502 and the balanced signal terminal 515, respectively, and the pitch ratio of the IDT to the reflector in each of the surface acoustic wave resonators 503*a* and 504*a* is made different. As a result, it is possible to obtain a surface acoustic wave device having a large common-mode attenuation at higher frequencies of the passband.

In the surface acoustic wave device 500*a* according to this preferred embodiment, although an example in which two longitudinally coupled resonator SAW filters having three IDTs are used is described, the surface acoustic wave device 500*a* may be configured to use two longitudinally coupled resonator SAW filters having five IDTs. Furthermore, the surface acoustic wave device having a balanced-to-unbalanced conversion function may be configured by using one longitudinally coupled resonator SAW filter. Furthermore, a surface acoustic wave device having a balanced-to-unbalanced conversion function may be configured by using a surface acoustic wave filter in which at least one IDT is divided in the direction of the propagation of the surface acoustic wave or in the direction of the finger overlap. In the above-described configuration, by making the pitch ratio of the IDT to the reflector in each surface acoustic wave resonator different from each other, a surface acoustic wave device having a large common-mode attenuation at higher frequencies of the passband can be obtained.

Fifth Preferred Embodiment

A fifth preferred embodiment of the present invention will now be described below with reference to FIGS. 26 to 29. For the sake of description, components having the same function as that of the components shown in the third and fourth preferred embodiments are designated with the same reference numerals, and accordingly, descriptions thereof are omitted.

A surface acoustic wave device 500*b* according to this preferred embodiment is configured in such a manner that, in the surface acoustic wave device 500 of the third preferred embodiment, instead of the surface acoustic wave resonators 503 and 504, surface acoustic wave resonators 503*b* and 504*b* are preferably used. The surface acoustic wave resonators 503*b* and 504*b* are arranged in such a manner that reflectors 522*b* and 525*b*, and reflectors 524*b* and 527*b* sandwich IDTs 523*b* and 526*b*, respectively. In the surface acoustic wave resonators 503*b* and 504*b*, the duties of the IDT 523*b* and the reflectors 522*b* and 524*b* in the surface acoustic wave resonator 503*b* differ from the duties of the IDT 526*b* and the reflectors 525*b* and 527*b* in the surface acoustic wave resonator 504*b*. The duties in the surface acoustic wave resonators 503*b* and 504*b* are about 0.620 and about 0.580, respectively. The other design parameters in the surface acoustic wave device 500*b* are preferably identical to those of the surface acoustic wave device 1500 in comparative example 1 described above.

Figure 27:
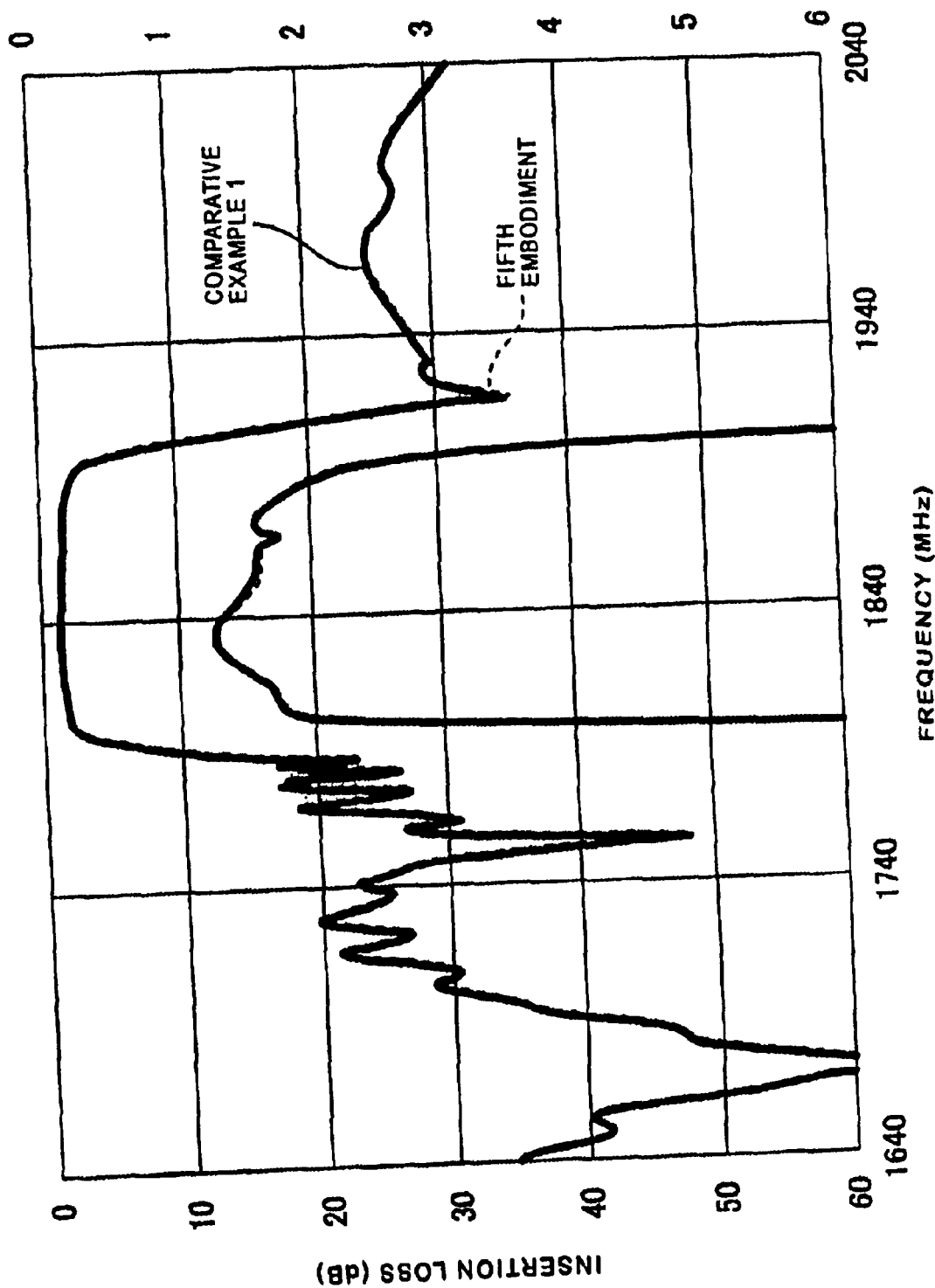
FIG. 27 is a graph showing SAW frequency-insertion loss characteristics in the surface acoustic wave device according to the fifth preferred embodiment of the present invention and the surface acoustic wave device of comparative example 1.
Figure 28:
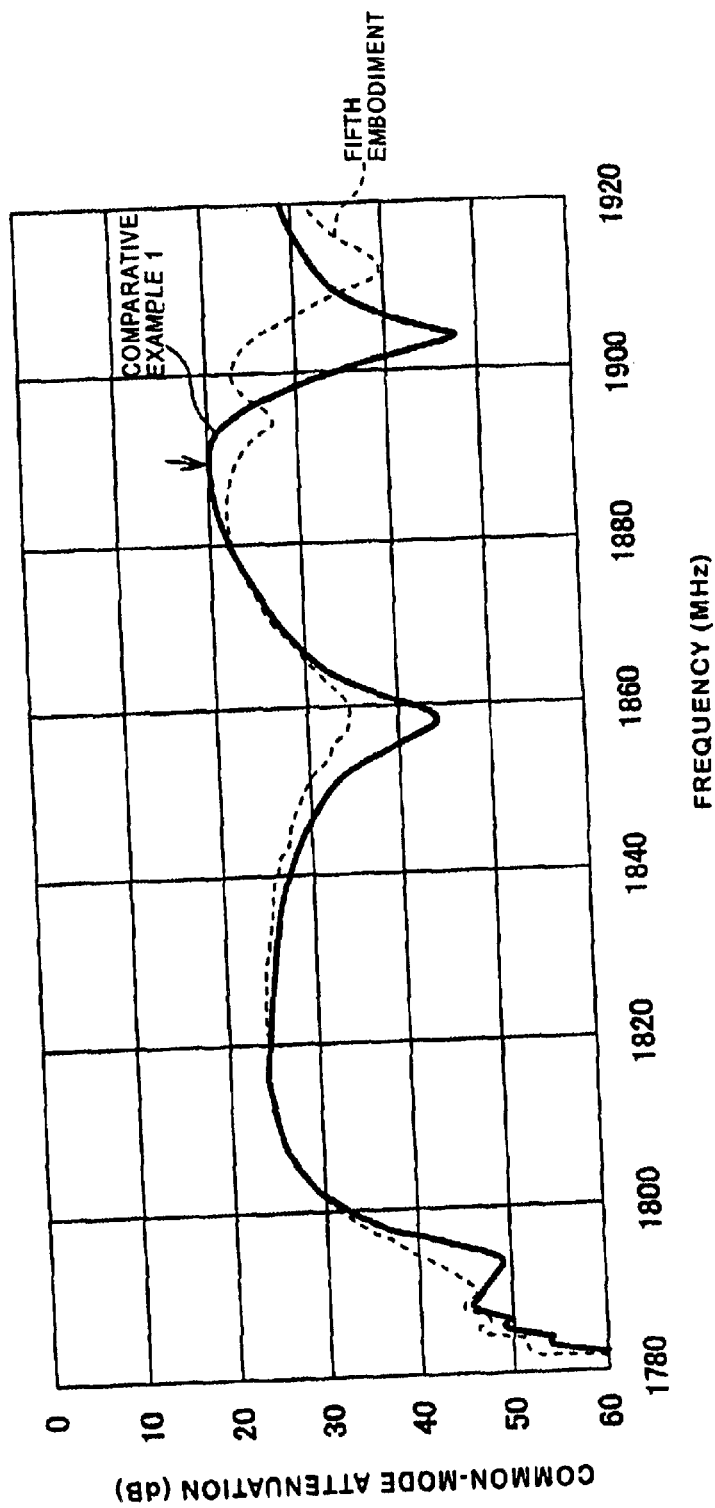
FIG. 28 is a graph showing frequency-common-mode attenuation characteristics in the surface acoustic wave device according to the fifth preferred embodiment of the present invention and the surface acoustic wave device of comparative example 1.

FIGS. 27 and 28 show frequency-insertion loss characteristics, and frequency-common-mode attenuation characteristics in the surface acoustic wave device 500*b* according to this preferred embodiment. FIGS. 27 and 28 also show frequency-insertion loss characteristics, and frequency-common-mode attenuation characteristics in the surface acoustic wave device 1500 of comparative example 1.

When FIG. 28 is viewed, in the surface acoustic wave device 500*a* according to this preferred embodiment, the common-mode attenuation in the vicinity of 1880 MHz to 1900 MHz is approximately 22 dB, whereas in the surface acoustic wave device 1500 of comparative example 1, the common-mode attenuation is approximately 20 dB. That is, it can be seen that this common-mode attenuation is improved by approximately 2 dB. At this time, a large deterioration of the common-mode attenuation within the passband does not occur. Furthermore, as can be seen by viewing FIG. 27, a deterioration of insertion loss within the passband also does not occur. This is due to the effect that, since the duties of the IDT and the reflector in the surface acoustic wave resonators 503*b* and 504*b* are made different, the amplitude and phase characteristics in the surface acoustic wave resonators 503*b* and 504*b* differ, and the deviation of the degree of balance at higher frequencies of the passband in the longitudinally coupled resonator SAW filters 501 and 502 is corrected.

Figure 29:
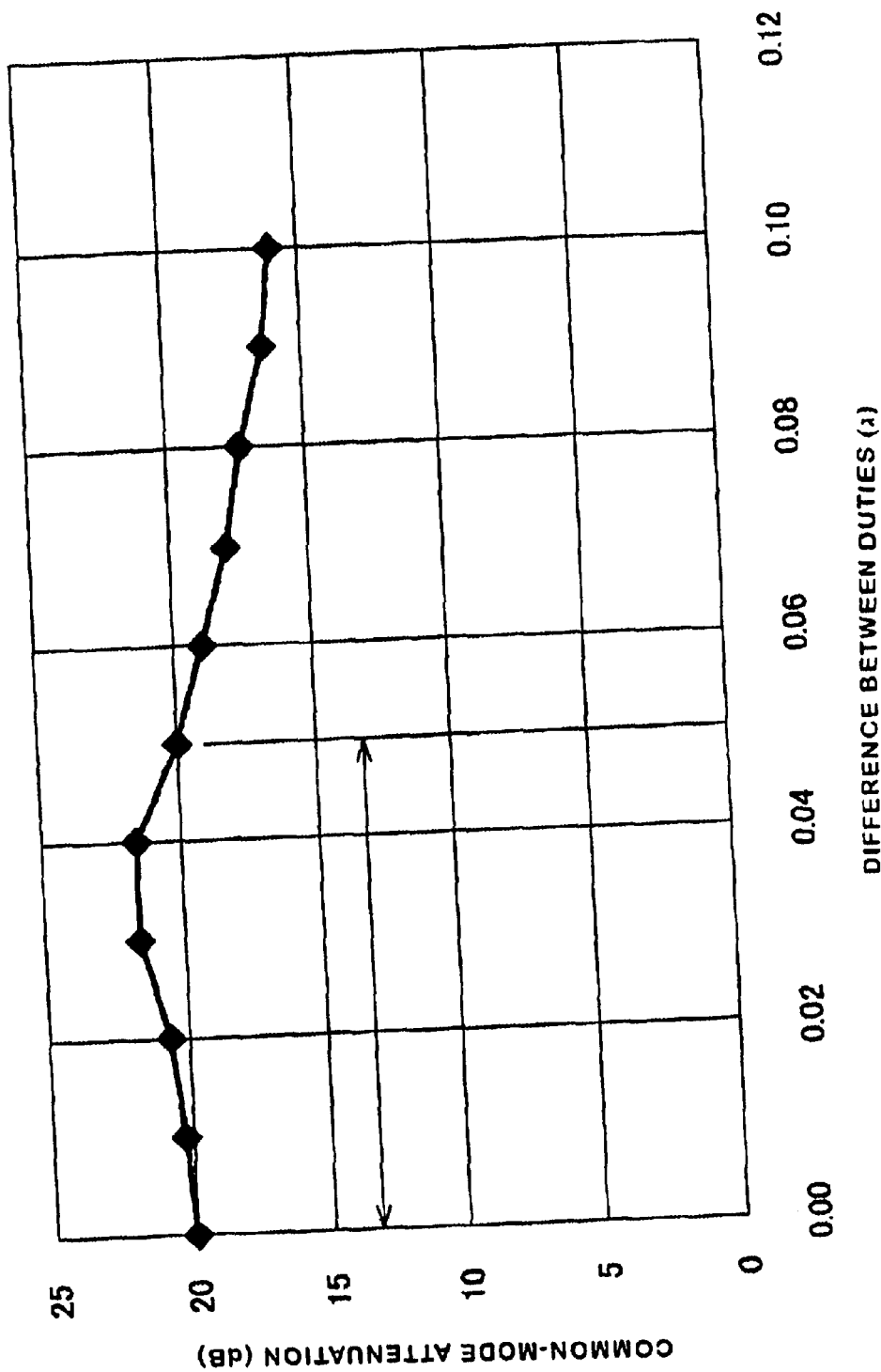
FIG. 29 is a graph in which the range in which the advantages of the surface acoustic wave device according to the fifth preferred embodiment of the present invention are obtained is checked.

Next, the range in which the common-mode attenuation is improved was studied. The study was made in such a manner that the duties (x) of the IDT 523*b* and the reflectors 522*b* and 524*b* in the surface acoustic wave resonator 503*b* and the duties (y) of the IDT 526*b* and the reflectors 525*b* and 527*b* in the surface acoustic wave resonator 504*b* are changed, and the common-mode attenuation at 1880 MHz to 1900 MHz with respect to the difference (x−y) between these duties was checked. The results are shown in FIG. 29. It can be seen from FIG. 29 that, until the difference between the duties is approximately 0.05, common-mode attenuation which is larger than that in a case where the duties of the surface acoustic wave resonators 503*b* and 504*b* are not made different is obtained. That is, in the surface acoustic wave device 500*b*, it can be seen that, preferably, the duty is in the range of approximately $0 \leq |x-y| < 0.05$.

As described in the foregoing, in the fifth preferred embodiment, in the surface acoustic wave device having a balanced-to-unbalanced conversion function by using two longitudinally coupled resonator SAW filters 501 and 502 in which surface acoustic wave resonators are connected in series, the surface acoustic wave resonators 503*a* and 504*a* are connected in series between the longitudinally coupled resonator SAW filters 501 and the balanced signal terminal 515 and between the longitudinally coupled resonator SAW filters 502 and the balanced signal terminal 515, respectively, and the duties of the IDT and the reflector in each of the surface acoustic wave resonators 503*a* and 504*a* are made different. As a result, it is possible to obtain a surface acoustic wave device having a large common-mode attenuation at higher frequencies of the passband.

Furthermore, in the surface acoustic wave device 500*b*, among the duties of the IDT 523*b* and the reflectors 522*b* and 524*b* in the surface acoustic wave resonator 503*b*, and the duties of the IDT 526*b* and the reflectors 525*b* and 527*b* in the surface acoustic wave resonator 504*b*, the duty of only the IDT of the surface acoustic wave resonator or the duty of only the reflector of the surface acoustic wave resonator may be made different. The same advantages can also be obtained in these configurations.

In the surface acoustic wave device 500*b* according to the fifth preferred embodiment, although an example in which two longitudinally coupled resonator SAW filters having three IDTs are preferably used is described, the surface acoustic wave device 500*b* may be configured to use two longitudinally coupled resonator SAW filters having five IDTs. Furthermore, a surface acoustic wave device having a balanced-to-unbalanced conversion function may be configured by using one longitudinally coupled resonator SAW filter. Furthermore, a surface acoustic wave device having a balanced-to-unbalanced conversion function may be configured by using a surface acoustic wave filter in which at least one IDT is divided in the direction of the propagation of the surface acoustic wave or in the direction of the finger overlap. In the above-described configuration, by making the duty of the IDT and the duty of the reflector in each surface acoustic wave resonator different from each other, a surface acoustic wave device having a large common-mode attenuation at higher frequencies of the passband can be obtained.

Furthermore, for example, by making different at least two of the distance between the centers of the outermost electrode fingers of the reflector and the IDT, the ratio of the pitch ratio of the reflector to the pitch ratio of the IDT, and the duties of the reflector and the IDT in each of the surface acoustic wave resonators 503 and 504 of comparative example 1, it is also possible to obtain a surface acoustic wave device having a large common-mode attenuation at higher frequencies of the passband.

Next, a communication device using a surface acoustic wave (SAW) device according to the above-described preferred embodiments will now be described with reference to FIG. 11. A communication device 600 preferably includes, on the receiver side (the Rx side) for performing reception, an antenna 601, an antenna duplexer section/RF Top filter 602, an amplifier 603, an Rx interstage filter 604, a mixer 605, a 1st IF filter 606, a mixer 607, a 2nd IF filter 608, a 1st+2nd local synthesizer 611, a TCXO (temperature compensated crystal oscillator) 612, a divider 613, and a local filter 614.

Figure 11:
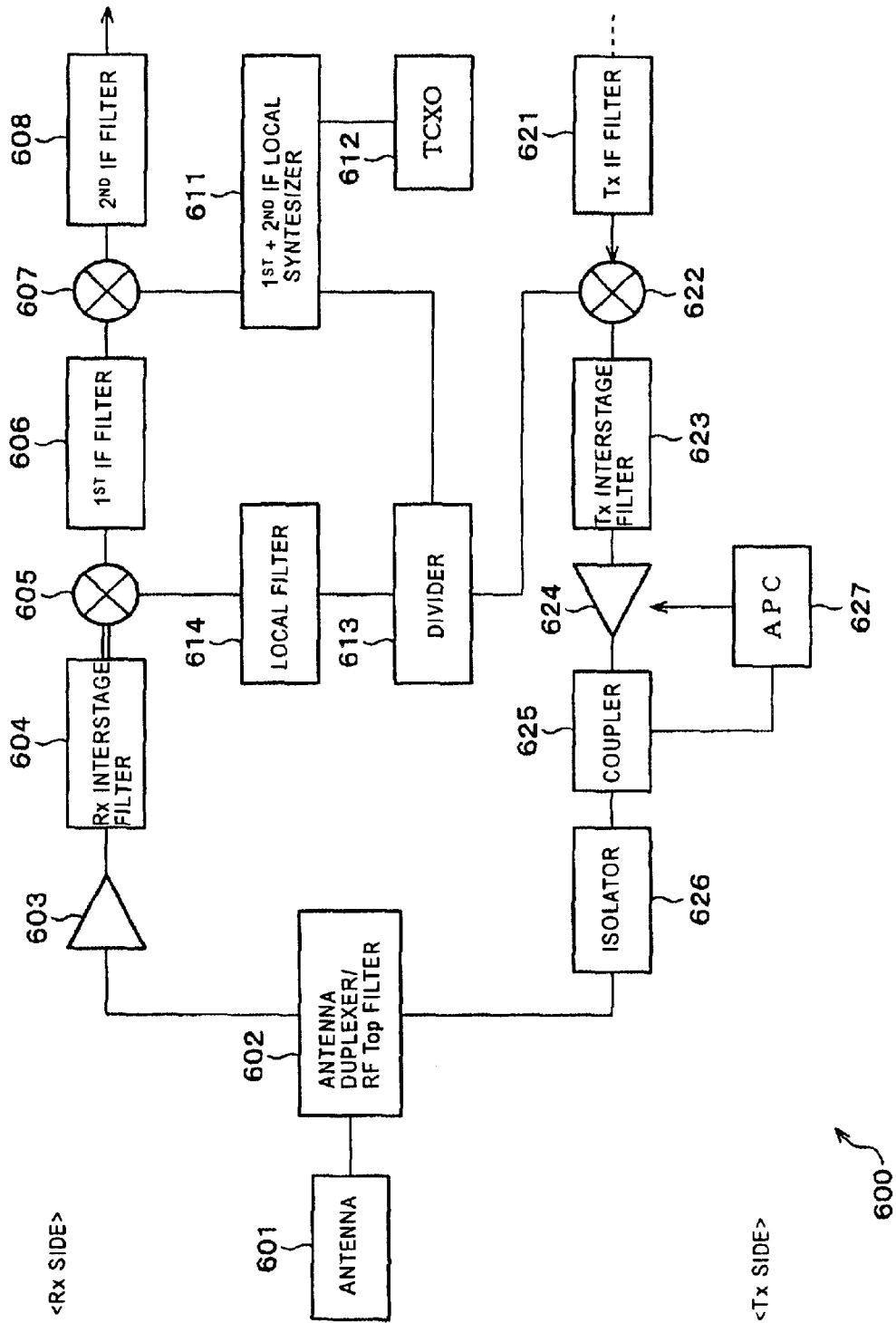
FIG. 11 is a block diagram of the essential portion of a communication device including the surface acoustic wave device according to preferred embodiments of the present invention.
Figure 12:
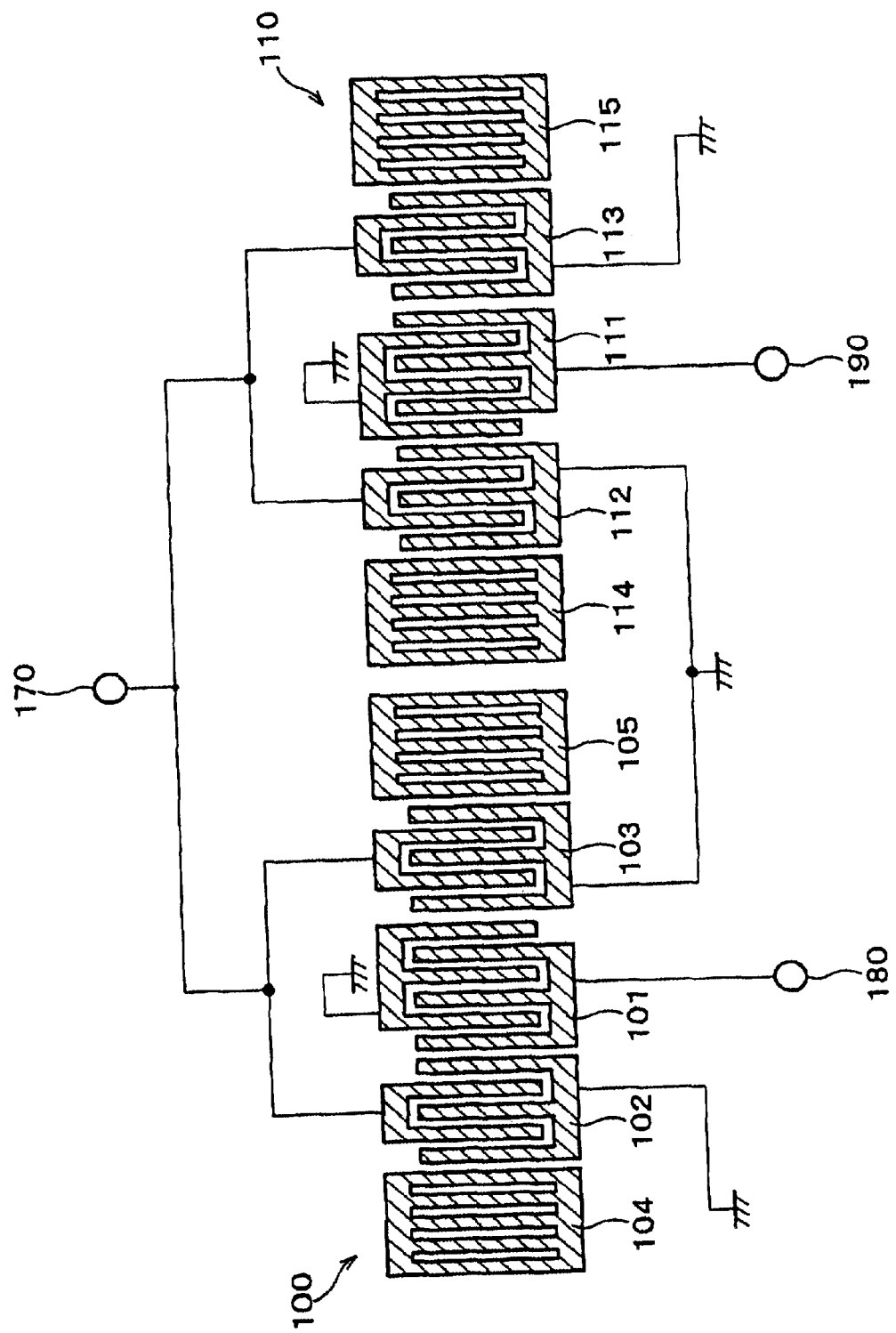
FIG. 12 is a schematic diagram of a conventional surface acoustic wave device.
Figure 13:
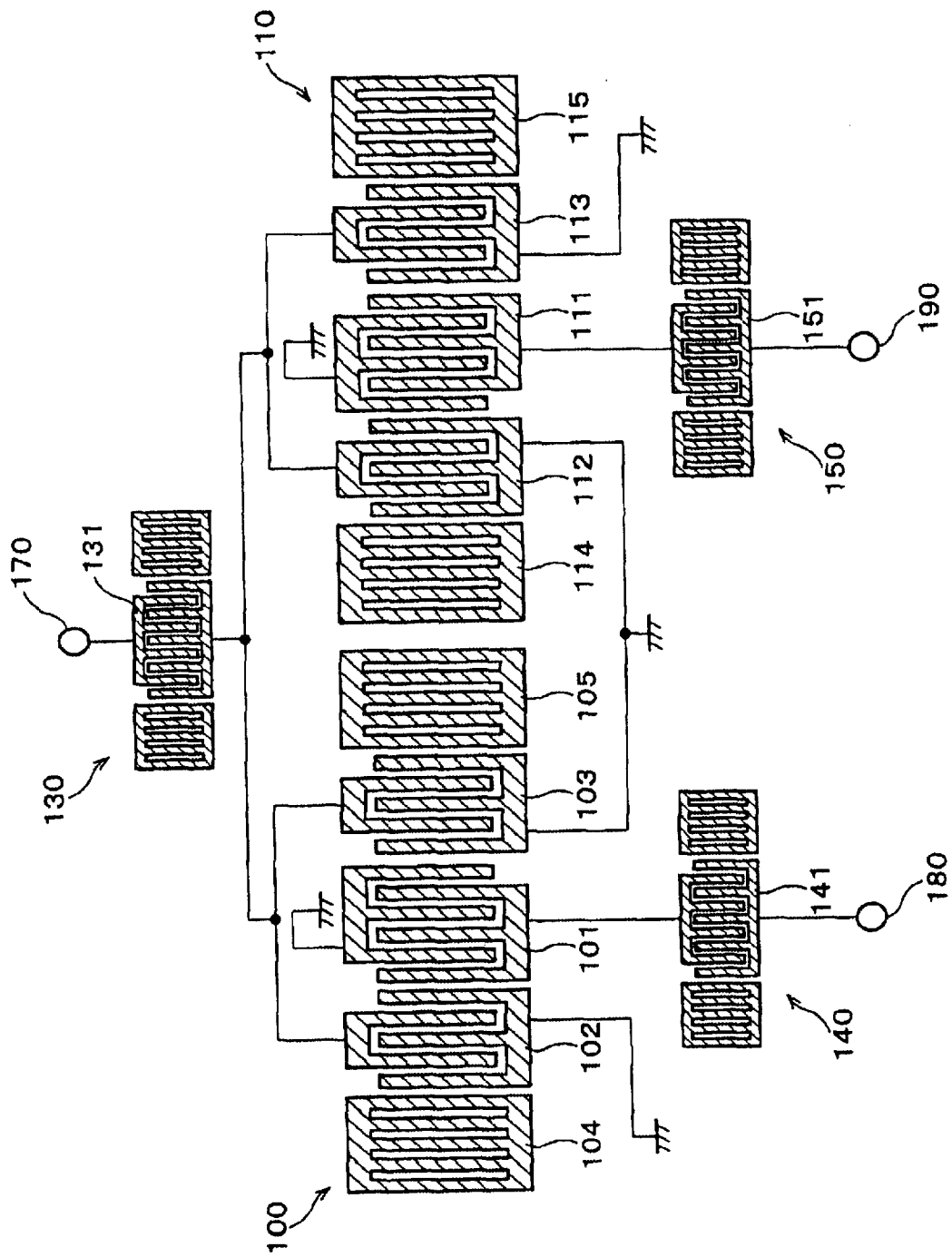
FIG. 13 is a schematic diagram of another conventional surface acoustic wave device.

It is preferable that transmission be performed from the Rx interstage filter 604 to the mixer 605 by each balanced signal in order to ensure balanced characteristics, as indicated by two lines in FIG. 11.

The communication device 600 commonly uses the antenna 601 and the antenna duplexer section/RF Top filter 602, and includes, on the transceiver side (the Tx side) for performing transmission, a Tx IF filter 621, a mixer 622, a Tx interstage filter 623, an amplifier 624, a coupler 625, an isolator 626, an APC (automatic power control) 627.

The SAW device described in the above-described preferred embodiments can be suitably used in the Rx interstage filter 604, the 1st IF filter 606, the Tx IF filter 621, and the Tx interstage filter 623.

The SAW device according to various preferred embodiments of the present invention can have a filter function and an unbalanced-to-balanced conversion function, and moreover, has superior characteristics such that the amplitude characteristics between balanced signals are closer to the ideal amplitude characteristics. Therefore, the communication device of another preferred embodiment the present invention, having such a unique SAW device, has greatly improved transmission characteristics.

The present invention is not limited to above-described preferred embodiments, and various modifications are possible within the scope described in the claims. All embodiments obtained by combining technical features and/or means disclosed in each of the different preferred embodiments described herein are included in the scope of the present invention.

What is claimed is:

1. A surface acoustic wave device comprising:
a first surface acoustic wave element having a plurality of interdigital transducers disposed along a propagation direction of a surface acoustic wave; and
a second surface acoustic wave element having a plurality of interdigital transducers disposed along the propagation direction of a surface acoustic wave, said surface acoustic wave device having an unbalanced-to-balanced conversion function of the phase of said second surface acoustic wave element being reversed by 180° with respect to said first surface acoustic wave element;
wherein a first resonator is connected in series to an unbalanced side of said first surface acoustic wave element, and a second resonator is connected in series to an unbalanced side of said second surface acoustic wave element, and the first resonator and the second resonator have different design parameters.

2. A surface acoustic wave device according to claim 1, wherein said first resonator and said second resonator are surface acoustic wave resonators including at least one interdigital transducer and reflectors arranged so as to sandwich the at least one interdigital transducer.

3. A surface acoustic wave device according to claim 1, wherein said design parameters are the numbers of electrode fingers in said first resonator and said second resonator.

4. A surface acoustic wave device according to claim 1, wherein said design parameters are amounts of finger overlaps in said first resonator and said second resonator.

5. A surface acoustic wave device according to claim 1, wherein said design parameters are duties of a reflector in said first resonator and said second resonator.

6. A surface acoustic wave device according to claim 5, wherein, when duties of said reflector in said first resonator and said second resonator are represented as x and y, respectively, a relationship $0 < |x-Y| \leq 0.05$ is satisfied.

7. A surface acoustic wave device according to claim 1, wherein said design parameters are duties of an interdigital transducer in said first resonator and said second resonator.

8. A surface acoustic wave device according to claim 7, wherein, when duties of said interdigital transducer in said first resonator and said second resonator are represented as x and y, respectively, a relationship $0 < |x-Y| \leq 0.05$ is satisfied.

9. A surface acoustic wave device according to claim 1, wherein said first and second resonators reflectors and interdigital transducers having fingers, and said design parameters are the distances between centers of outermost electrode fingers of the reflectors and the interdigital transducer in said first resonator and said second resonator.

10. A surface acoustic wave device according to claim 9, wherein, when the wavelength determined by the structure of the Interdigital transducers of said surface acoustic wave element is denoted as λ, and the distances between the centers of the outermost electrode fingers of the reflectors and the interdigital transducers in said first resonator and said second resonator are denoted as Xλ and Yλ, respectively, a relationship $(0+0.5\,n)\lambda < |X-Y|\lambda \leq (0.18+0.5\,n)\lambda$, where $n = 0, 1, 2 \ldots$, is satisfied.

11. A surface acoustic wave device according to claim 1, wherein said first and second resonators reflectors and interdigital transducers having fingers, and said design parameters are pitch ratios of the reflector and the interdigital transducer in said first resonator and said second resonator.

12. A surface acoustic wave device according to claim 11, wherein, when pitch ratios of the reflector and the interdigital transducer defined by a pitch of the interdigital transducer to a pitch of the reflector in said first resonator and said second resonator are denoted as a and b, respectively, a relationship of $0.984 \leq a/b < 1$ is satisfied.

13. A surface acoustic wave device according to claim 1, further comprising a package, wherein said surface acoustic wave device is housed in said package and mounted in said package in a face-down manner.

14. A surface acoustic wave device according to claim 1, wherein each of the first and second surface acoustic wave elements define two longitudinally coupled resonator SAW filters each having three interdigital transducers.

15. A surface acoustic wave device according to claim 1, wherein each of the first and second surface acoustic wave elements define two longitudinally coupled resonator SAW filters each having five interdigital transducers.

16. A communication device comprising a surface acoustic wave device according to claim 1.

* * * * *